US011244949B2

(12) United States Patent
Weckx et al.

(10) Patent No.: US 11,244,949 B2
(45) Date of Patent: Feb. 8, 2022

(54) SEMICONDUCTOR DEVICE HAVING STACKED TRANSISTOR PAIRS AND METHOD OF FORMING SAME

(71) Applicant: IMEC vzw, Leuven (BE)

(72) Inventors: Pieter Weckx, Bunsbeek (BE); Juergen Boemmels, Heverlee (BE); Julien Ryckaert, Schaerbeek (BE)

(73) Assignee: IMEC vzw, Leuven (BE)

( * ) Notice: Subject to any disclaimer, the term of this patent is extended or adjusted under 35 U.S.C. 154(b) by 238 days.

(21) Appl. No.: 16/441,725

(22) Filed: Jun. 14, 2019

(65) Prior Publication Data

US 2019/0386011 A1 Dec. 19, 2019

(30) Foreign Application Priority Data

Jun. 15, 2018 (EP) ..................................... 18178065

(51) Int. Cl.
*H01L 29/76* (2006.01)
*H01L 27/11* (2006.01)
(Continued)

(52) U.S. Cl.
CPC .......... *H01L 27/1104* (2013.01); *G11C 5/025* (2013.01); *G11C 5/06* (2013.01);
(Continued)

(58) Field of Classification Search
None
See application file for complete search history.

(56) References Cited

U.S. PATENT DOCUMENTS 9,472,558 B1 * 10/2016 Cheng ............. H01L 21/823814
2006/0220134 A1 * 10/2006 Huo ..................... H01L 27/1203
257/351
(Continued)

OTHER PUBLICATIONS

European Search Report dated Nov. 15, 2018 in Application No. 18178065.1 in 10 pages.

*Primary Examiner* — Hung K Vu
(74) *Attorney, Agent, or Firm* — Knobbe, Martens, Olson & Bear, LLP

(57) ABSTRACT

The disclosed technology generally relates to semiconductor devices and more particularly to a semiconductor device comprising stacked complementary transistor pairs. In one aspect, a semiconductor device comprises first and second sets of transistors comprising a pass transistor and a stacked complementary transistor pair of a lower transistor and an upper transistor, wherein first transistor comprises a semiconductor channel extending along a horizontal first fin track, and each second transistor comprises a semiconductor channel extending along a second fin track parallel to the first fin track, and wherein the semiconductor channels of the pass transistors and of the lower transistors are arranged at a first level and the semiconductor channels of said upper transistors are arranged at a second level, a first tall gate electrode forming a common gate for the first complementary transistor pair and arranged along a horizontal first gate track, and a first short gate electrode forming a gate for the first pass transistor and arranged along a second gate track, a second tall gate electrode forming a common gate for the second complementary transistor pair and arranged along the second gate track, a second short gate electrode forming a gate for the second pass transistor and arranged along the first gate track, first and second contact arrangements forming a common drain contact for the transistors of the first set and the second set, respectively, and first and second cross-
(Continued)

couple contacts extending horizontally between and interconnecting the first tall gate electrode and the second contact arrangement, and the second tall gate electrode and the first contact arrangement, respectively.

15 Claims, 13 Drawing Sheets

(51) Int. Cl.
*G11C 5/02* (2006.01)
*G11C 5/06* (2006.01)
*G11C 11/412* (2006.01)
*H01L 21/822* (2006.01)
*H01L 21/8238* (2006.01)

(52) U.S. Cl.
CPC ........ *G11C 11/412* (2013.01); *H01L 21/8221* (2013.01); *H01L 21/8238* (2013.01)

(56) References Cited

U.S. PATENT DOCUMENTS

| | | |
|---|---|---|
| 2006/0289940 A1 | 12/2006 | Hyun et al. |
| 2007/0018166 A1* | 1/2007 | Atanackovic ... H01L 21/823807 257/64 |
| 2009/0189227 A1 | 7/2009 | Miyashita |
| 2011/0031473 A1* | 2/2011 | Chang ................ H01L 27/1203 257/24 |
| 2012/0193719 A1 | 8/2012 | Or-Bach et al. |
| 2013/0193515 A1 | 8/2013 | Cheng et al. |
| 2014/0035041 A1 | 2/2014 | Pillarisetty et al. |
| 2014/0312427 A1 | 10/2014 | Maeda et al. |
| 2016/0211264 A1 | 7/2016 | Peng |

* cited by examiner

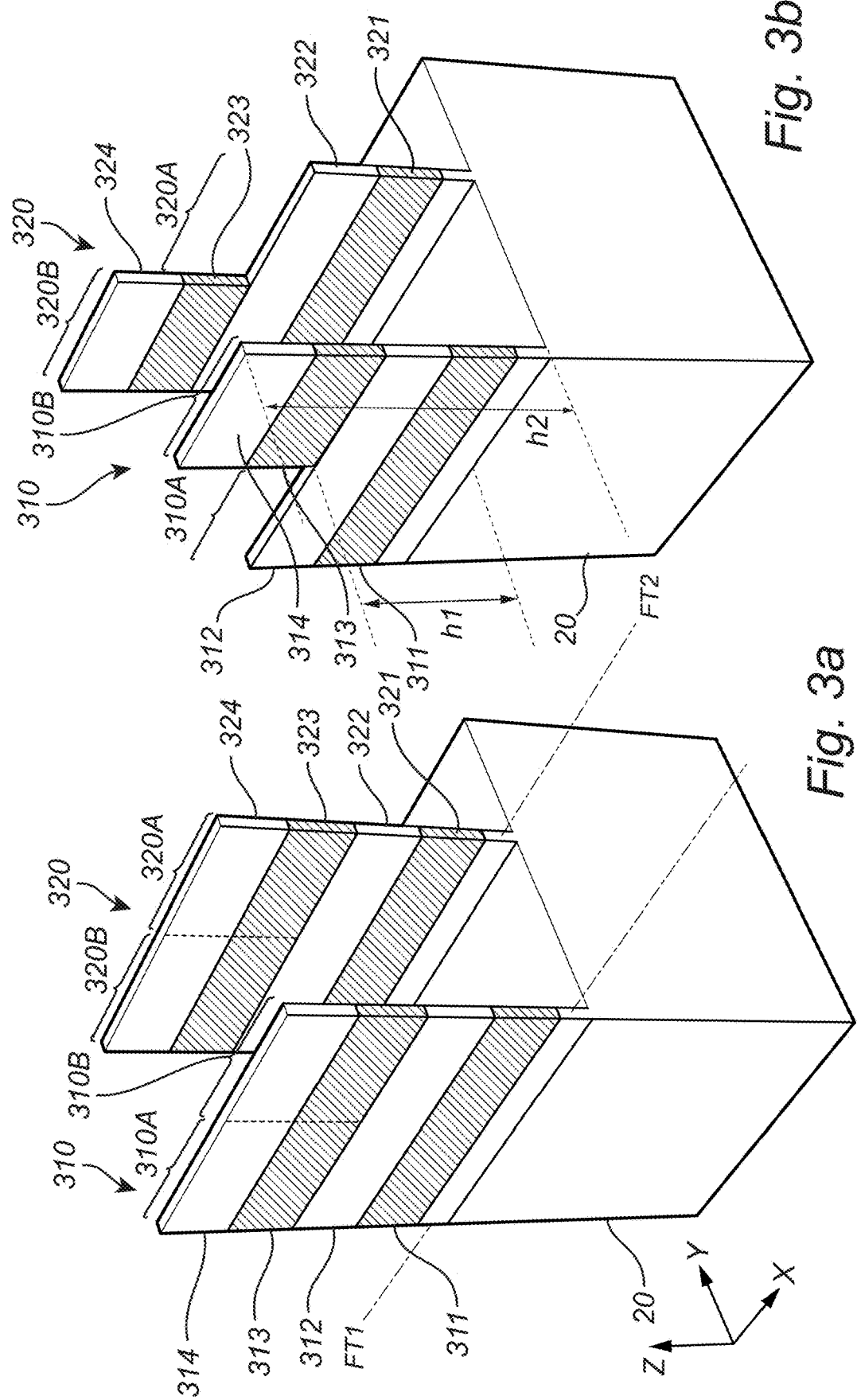

SEMICONDUCTOR DEVICE HAVING STACKED TRANSISTOR PAIRS AND METHOD OF FORMING SAME

CROSS-REFERENCE TO RELATED APPLICATIONS

This application claims foreign priority to European Patent Application No. EP 18178065.1, filed Jun. 15, 2018, the content of which is incorporated by reference herein in its entirety.

BACKGROUND

Field

The disclosed technology generally relates to semiconductor devices and more particularly to a semiconductor device comprising stacked complementary transistor pairs and a method of forming the semiconductor device.

Description of the Related Technology

The design of integrated circuits typically involves combining a great number of functional cells, where each cell includes a plurality of transistors interconnected to provide a desired function. For example, logic circuits comprise a plurality of logic cells configured to perform a logic function, while memory circuits comprise a plurality of memory cells or bit cells configured to store one or more bits. One notable example of a memory circuit is the static random access memory (SRAM). In conventional SRAM technology, the bit cells occupy a relatively large portion of the total die surface area.

While continuing advances in miniaturization of transistors would seem to allow ever smaller cell designs and thus denser circuits, the development of transistors of decreasing dimensions may by itself not be enough to enable area efficient circuitry. Indeed, also the layout and the interconnection of the transistors need consideration.

SUMMARY OF CERTAIN INVENTIVE ASPECTS

An objective of the disclosed technology is to provide a semiconductor device that can improve the area efficiency of circuit design. Further and alternative objectives may be understood from the following.

According to a first aspect of the disclosed technology there is provided a semiconductor device comprising:

first and second sets of transistors arranged on a substrate, each set comprising a pass transistor and a stacked complementary transistor pair of a lower transistor and an upper transistor, wherein each transistor of the first set comprises a semiconductor channel extending between respective source and drain regions along a horizontal first fin track, and each transistor of the second set comprises a semiconductor channel extending between respective source and drain regions along a second fin track parallel to the first fin track, and wherein the semiconductor channels of said pass transistors and the semiconductor channels of said lower transistors are arranged at a first level above the substrate and the semiconductor channels of said upper transistors are arranged at a second level above the first level, a first tall gate electrode forming a common gate for the semiconductor channels of the first complementary transistor pair and arranged along a horizontal first gate track transverse to said fin tracks, and a first short gate electrode forming a gate for the semiconductor channel of the first pass transistor and arranged along a second gate track parallel to the first gate track, a second tall gate electrode forming a common gate for the semiconductor channels of the second complementary transistor pair and arranged along the second gate track, a second short gate electrode forming a gate for the semiconductor channel of the second pass transistor and arranged along the first gate track, first and second contact arrangements arranged between the first and second gate tracks and forming a common drain contact for the transistors of the first set and the second set, respectively, a first cross-couple contact extending horizontally between and interconnecting the first tall gate electrode and the second contact arrangement, and a second cross-couple contact extending horizontally between and interconnecting the second tall gate electrode and the first contact arrangement.

The disclosed semiconductor device enables area-efficient circuitry through a combination of device designs: employing the vertical dimension for forming the stacked complementary transistor pairs, and providing a single common gate electrode for each of the stacked transistor pairs reduces the surface area needed for the complementary transistor pairs.

Secondly, arranging the gate electrode of the first complementary transistor pair on a same gate track as the gate electrode of the second pass transistor, and arranging the gate electrode of the second complementary transistor pair on a same gate track as the gate electrode of the first pass transistor enables a further increase in area efficiency. For example, the transistors of the semiconductor device can occupy only a width corresponding to two adjacent gate tracks. This in turn can enable the drains of the first set of transistors and the drains of the second set of transistors, respectively, to be interconnected by the respective first and second contact arrangements arranged between the two gate tracks.

The cross-couple contacts further enable the first and second complementary transistor pairs to be cross-coupled to each other in an area-efficient manner, without relying on interconnects in higher level interconnection structures in the back end of line.

Additionally, by making the gate electrodes of the pass transistors short (e.g., with a height shorter than a height of the tall gate electrodes of the complementary transistor pairs) there is provided a space above the short gate electrodes which provides a margin between the short gate electrodes and the first/second cross-couple contacts. This margin may enable reduced capacitive coupling between the short gate electrodes and the first/second cross-couple contacts and may also relax the processing margins for forming the cross-coupling contacts during fabrication.

Without limitation, the disclosed semiconductor device may advantageously be put to use, e.g., in a static random access memory (SRAM). The first and second transistor sets, the gate electrodes, the contact arrangements and the cross-couple contacts may form part of a bit cell for an SRAM. The bit cell may comprise a first and a second half-cell. The first half-cell may comprise the first transistor set, the first tall and short gate electrodes and the first contact arrangement. The second half-cell may comprise the second transistor set, the second tall and short gate electrodes and the second contact arrangement. The first and second cross-couple contacts may interconnect the first and second half-cells.

The disclosed semiconductor device, however, are not limited to SRAM applications but may more generally be used in any circuit design requiring a pass transistor connected to a complementary transistor pair, such as transmission gate logic.

By a stacked pair of transistors is hereby meant a vertical arrangement of two transistors at a lower first level and an upper second level above, or at different distances from, the substrate, as viewed along a vertical direction. Vertical direction here refers to the normal direction to (a main surface of) the substrate. Meanwhile, a horizontal direction refers to a direction parallel to (the main surface of) the substrate.

A complementary pair of transistors may comprise a pair of transistors having opposite channel types, i.e. an n-type transistor and a p-type transistor.

The first and second complementary transistor pairs may be configured as a respective inverter pair. The two inverter pairs together form a pair of cross-coupled inverters by means of the cross-couple contacts.

One of the transistors of the each complementary transistor pair may be configured as a pull-up transistor and the other transistor of the pair may be configured as a pull-down transistor.

The designation "pull-up", "pull-down" or "pass" for a transistor should herein be construed as said transistor being adapted to function or operate as a pull-up, pull-down or pass transistor in the context of the conventional understanding of (CMOS) inverters or SRAM bit cells.

The transistors of the first and second set may be field-effect transistors (FETs). The first complementary transistor pair may accordingly comprise a first CMOS pair, which includes a first nFET (i.e., an n-type FET) and a first pFET (i.e., a p-type FET). Correspondingly, the second complementary transistor pair may comprise a second CMOS pair. The first and second pass transistors may each be an nFET or a pFET.

The first transistor set comprises semiconductor channels extending along the first fin track and the second transistor set comprises semiconductor channels extending along the second fin track which is different from and parallel to the first fin track. A fin track may thus be defined as the horizontal geometrical line which the semiconductor channels of a transistor set are formed along and parallel to.

The first tall gate electrode and the second short gate electrode are arranged along the first gate track and the second tall gate electrode and the first short gate electrode are arranged along the second gate track which is different from and parallel to the first gate track. A gate track may thus be defined as the horizontal geometrical line which gate electrodes are formed along and parallel to. Preferably, the first and second gate tracks may be adjacent gate tracks.

As the first tall gate electrode forms a common gate for the semiconductor channels of the first complementary transistor pair, the first tall gate electrode may be configured to control the conductivity of both semiconductor channels of the first complementary transistor pair. The first tall gate electrode may enclose the semiconductor channels of the first complementary transistor pair partially or completely.

As the second tall gate electrode forms a common gate for the semiconductor channels of the second complementary transistor pair, the second tall gate electrode may be configured to control the conductivity of both semiconductor channels of the second complementary transistor pair. The second tall gate electrode may enclose the semiconductor channels of the second complementary transistor pair partially or completely.

As the first short gate electrode forms a gate for the semiconductor channel of the first pass transistor, the first short gate electrode may be configured to control the conductivity of the first pass transistor channel. The first short gate electrode may enclose the first pass transistor channel partially or completely.

As the second short gate electrode forms a gate for the semiconductor channel of the second pass transistor, the second short gate electrode may be configured to control the conductivity of the second pass transistor channel. The second short gate electrode may enclose the second pass transistor channel partially or completely.

The semiconductor channel of one or more transistor of the first and second transistor set may advantageously be formed in one or more horizontal semiconductor nanowires or fins. The gate electrodes may accordingly be configured as gate all around electrodes completely enclosing/wrapping around the channel region of the respective one or more nanowires or fins. A horizontal semiconductor nanowire may here refer to a semiconductor structure extending horizontally along the substrate and suspended above the substrate. The nanowire may form a semiconductor body having a closed circumferentially extending bounding surface. Various lateral aspect ratios are possible, such as a width to height ratio close to unity, or a width to height ratio greater than one (such as a horizontally oriented nano-sheet semiconductor structure or fin) or smaller than one (such as a vertically oriented nano-sheet or fin). The nanowire can also have any one of various suitable shapes, including nanowires having circular, ovular or polygonal (e.g., rectangular) cross-sectional shapes. The source and drain regions of the transistor may also be formed in opposite ends of the nanowire. Source and drain contacts of the transistor may completely enclose/wrap around the source and drain regions of the respective one or more nanowires.

The first cross-couple contact may comprise a first end arranged in contact with the first tall gate electrode at a first interface, a second end arranged in contact with the second contact arrangement at a second interface, and a body extending from the first interface to the second interface in a horizontal path. Hence, the first cross-couple contact may extend horizontally, at a vertical level of the first tall gate electrode.

Advantageously, the horizontal path may run above the second short gate electrode. Hence, the first cross-couple contact may extend horizontally through the available space, directly above the second short gate electrode. This enables a further improved area efficiency of the semiconductor device.

More specifically, the horizontal path of the first cross-couple contact may extend from the first interface, in a direction along the first gate track, to a horizontal position directly above the second short gate electrode, and from said horizontal position, in a direction along the second fin track, to the second interface.

Correspondingly, the second cross-couple contact may comprise a first end arranged in contact with the second tall gate electrode at a first interface, a second end arranged in contact with the first contact arrangement at a second interface, and a body extending from the first interface to the second interface in a horizontal path. Advantageously, the horizontal path may run above the first short gate electrode. Hence, the second cross-couple contact may extend horizontally through the available space, directly above the first short gate electrode. More specifically, the horizontal path of the second cross-couple contact may extend from the first interface, in a direction along the second gate track, to a horizontal position directly above the first short gate electrode, and from said horizontal position, in a direction along the first fin track, to the second interface.

The first tall gate electrode and the second short gate electrode may be arranged between a first pair of gate trench spacers extending on opposite sides of and along the first gate track, wherein the first cross-couple contact extends through the sidewall spacer of said pair which is arranged between the first gate track and the second contact arrangement. In other words, the first tall gate electrode and the second short gate electrode may be arranged or formed within a common first gate trench (which extends along the first gate track). By arranging the first cross-couple contact to extend through the gate trench spacer, the cross-coupling of the first tall gate electrode and the second short gate electrode may directly bridge the spacer without routing via higher level interconnections.

Correspondingly, the second tall gate electrode and the first short gate electrode may be arranged between a second pair of dielectric sidewall spacers extending on opposite sides of and along the second gate track, wherein the second cross-couple contact extends through the sidewall spacer of said pair which is arranged between the second gate track and the first contact arrangement.

The first contact arrangement may comprise:

a lower contact part forming a drain contact for the pass transistor and the lower transistor of the first transistor set, and an upper contact part forming a drain contact for the upper transistor of the first transistor set.

Thus, the first contact arrangement may be formed by the lower contact part arranged at the first level and the upper contact part arranged at the second level. This design of the first contact arrangement enables the drains of the first transistor set to be interconnected. The upper and lower contact parts of the first contact arrangement may be arranged along the first fin track.

Correspondingly, the second contact arrangement may comprise:

a lower contact part forming a drain contact for the pass transistor and the lower transistor of the second transistor set, and an upper contact part forming a drain contact for the upper transistor of the second transistor set. The upper and lower contact parts of the second contact arrangement may be arranged along the second fin track.

According to a second aspect of the disclosed technology, there is provided a method for forming a semiconductor device, the method comprising:

forming first and second sets of transistors on a substrate along a horizontal first fin track and a parallel second fin track, respectively, each set comprising a pass transistor and a stacked complementary transistor pair of a lower transistor and upper transistor, wherein forming the stacked complementary transistor pair of the first set comprises forming a lower semiconductor channel at a first level above the substrate and an upper semiconductor channel at a second level above the first level, the lower and upper semiconductor channels extending between respective source and drain regions along the first fin track, and forming a first tall gate electrode along a horizontal first gate track transverse to said fin tracks, the first tall gate electrode forming a common gate for the upper and lower semiconductor channels, wherein forming the pass transistor of the first set comprises forming a first pass transistor semiconductor channel at the first level, the pass transistor semiconductor channel extending between a source and drain region along the first fin track, and forming a first short gate electrode along a second gate track parallel to the first gate track, the first short gate electrode forming a gate for the first pass transistor semiconductor channel, wherein forming the stacked complementary transistor pair of the second set comprises forming a lower semiconductor channel at the first level and an upper semiconductor channel at the second level, the lower and upper semiconductor channels extending between respective source and drain regions along the second fin track, and forming a second tall gate electrode along the second gate track, the second tall gate electrode forming a common gate for the upper and lower semiconductor channels, wherein forming the pass transistor of the second set comprises forming a second pass transistor semiconductor channel at the first level, the pass transistor semiconductor channel extending between a source and drain region along the second fin track, and forming a second short gate electrode along the first gate track, the second short gate electrode forming a gate for the second pass transistor semiconductor channel, forming first and second contact arrangements along a contact track extending parallel to and between the first and second gate tracks, the first and second contact arrangements forming a common drain contact for the transistors of the first set and the transistors of the second set, respectively, forming a first cross-couple contact extending horizontally between and interconnecting the first tall gate electrode and the second contact arrangement, and forming a second cross-couple contact extending horizontally between and interconnecting the second tall gate electrode and the first contact arrangement.

This aspect enables fabrication of a semiconductor device having the merits discussed in connection with the first aspect. The discussion of details, advantages and variations of the device aspect apply correspondingly to the method aspect. Hence, to avoid undue repetition, reference is made to the above.

According to an embodiment of the method, subsequent to forming said contact arrangements along the contact track, said contact arrangements may be covered by a contact insulting layer, and, subsequent to forming said gate electrodes along the first and second gate tracks, said gate electrodes may be covered by a gate insulating layer. Forming the first and second cross-couple contacts may further comprise:

forming a first cross-couple contact trench and a second cross-couple contact trench extending horizontally through the gate and contact insulating layers, the first cross-couple contact trench exposing the first tall gate electrode and the second contact arrangement, and the second cross-couple contact trench exposing the second tall gate electrode and the first contact arrangement, and depositing a conductive material in the first and second cross-couple contact trenches.

Thereby the first and second cross-couple contact trenches may be formed by the conductive material deposited in the first and second cross-couple contact trenches.

Forming the first cross-couple contact trench may comprise forming:

a first trench portion in the gate insulating layer exposing an upper portion of the first tall gate electrode and running above the second short gate electrode, and a second trench portion in the contact insulating layer exposing an upper portion of the second contact arrangement Forming the second cross-couple contact trench may comprise forming:

a first trench portion in the gate insulating layer exposing an upper portion of the second tall gate electrode and running above the first short gate electrode, and a second trench portion in the contact insulating layer exposing an upper portion of the first contact arrangement.

The first trench portion of the first cross-couple contact may accordingly run over the second short gate electrode in the sense that a bottom surface portion of the first trench portion is formed by a thickness portion of the gate insulating layer formed on an upper surface of the second short gate electrode.

Correspondingly, the first trench portion of the second cross-couple contact may run over the first short gate electrode in the sense that a bottom surface portion of the first trench portion is formed by a thickness portion of the gate insulating layer formed on an upper surface of the first short gate electrode.

The first tall gate electrode and the second short gate electrode may be formed in a first and a second gate trench section, respectively, formed along the first gate track, the first and second gate trench sections being formed between a first pair of gate trench spacers extending along the first gate track.

The second tall gate electrode and the first short gate electrode may be formed in a third and a fourth gate trench section, respectively, formed along the second gate track, the third and fourth gate trench sections being formed between a second pair of gate trench spacers extending along the second gate track.

The first cross-couple contact trench may be formed to extend through the sidewall spacer of said first pair which is arranged between the first gate track and the second contact arrangement. The second cross-couple contact trench may be formed to extend through the sidewall spacer of said second pair which is arranged between the second gate track and the first contact arrangement.

Hence, the first and second cross-couple contact trenches may extend horizontally through the sidewall spacer of the respective gate trench.

Forming the first and second tall and short gate electrodes may comprise:

depositing a conductive gate material in a first and a second gate trench section formed along the first gate track, the first gate trench section extending across the first fin track and the second gate trench section extending across the second fin track, and in a third and a fourth gate trench section formed along the second gate track, the third gate trench section extending across the second fin track and the fourth gate trench section extending across the first fin track, and etching back an upper surface of the conductive gate material deposited in the second gate trench section and an upper surface of the conductive gate material deposited in in the fourth gate trench section. Thereby, the conductive gate material forming each of the gate electrodes may be simultaneously deposited, while the first and second short gate electrodes may be formed with a height less than a height of the first and second tall gate electrodes by a subsequent etch back step. The previously discussed space above the short gate electrodes, which provides a margin between the short gate electrodes and the first/second cross-couple contacts, may thereby be created.

The method may further comprise:

forming a first dummy gate extending along the first gate track and across the first and the second fin tracks, and a second dummy gate extending along the second gate track and across the first and the second fin tracks, and forming an insulating layer along the first and second dummy gates, wherein said gate trench sections are formed by removing the first and second dummy gates.

Thus, the gate electrodes may be formed using a replacement metal gate process.

According to the method, forming the semiconductor channels of the first and second sets of transistors may comprise:

forming a first semiconductor fin and a second semiconductor fin extending along the first and second fin track, respectively, each fin comprising a lower semiconductor layer and an upper semiconductor layer, selectively removing the upper semiconductor layer along a horizontal first portion of the first fin, along which the first pass transistor semiconductor channel is to be formed, such that the first fin protrudes by a first height above the substrate along the first portion and by a second height above the substrate, greater than the first height, along a horizontal second portion of the first fin, along which the first lower and upper semiconductor channels are to be formed, and selectively removing the upper semiconductor layer along a horizontal first portion of the second fin, along which the second pass transistor semiconductor channel is to be formed, such that the second fin protrudes by the first height above the substrate along the first portion and by the second height above the substrate along a horizontal second portion of the second fin, along which the second lower and upper semiconductor channels are to be formed Hence, the semiconductor channels for the first and second transistor sets may be formed from upper and lower layers of two semiconductor fins. Additionally, by cutting away the upper semiconductor layer in the regions of the first and second fins where the pass transistors are to be formed, enables to creating an available space above the first and second fins for the cross-couple contacts to pass through.

The pass transistor semiconductor channel of the first set of transistors may be formed by a lower layer portion extending along the first portion of the first fin and the lower and upper transistor semiconductor channels of the first set of transistors may be formed by a lower layer portion and an upper layer portion, respectively, extending along the second portion of the first fin. The pass transistor semiconductor channel of the second set of transistors may be formed by a lower layer portion extending along the first portion of the second fin and the lower and upper transistor semiconductor channels of the second set of transistors may be formed by a lower layer portion and an upper layer portion, respectively, extending along the second portion of the second fin.

The first fin and the second fin may each further comprise a sacrificial layer intermediate the lower and the upper semiconductor layers wherein the method may further comprise, prior to forming said gate electrodes, removing the sacrificial layers of the first and second fin. Thereby, the upper layer semiconductor channel portions may be formed as nanowires.

The first fin and the second fin may each further comprise, in addition to the intermediate sacrificial layer, a lower sacrificial layer below the lower semiconductor layer, wherein the method may further comprise: prior to forming said gate electrodes, removing the lower and intermediate sacrificial layers of the first and second fin.

Thereby, the pass transistor semiconductor channel portions, as well as the lower and upper layer semiconductor channel portions, may be formed as nanowires.

BRIEF DESCRIPTION OF THE DRAWINGS

The above, as well as additional objects, features and advantages of the disclosed technology, will be better understood through the following illustrative and non-limiting detailed description, with reference to the appended drawings.

FIGS. 3a-3m illustrate intermediate structures at various stages of fabricating a semiconductor device, according to embodiments.

DETAILED DESCRIPTION OF CERTAIN ILLUSTRATIVE EMBODIMENTS

Figure 1A:
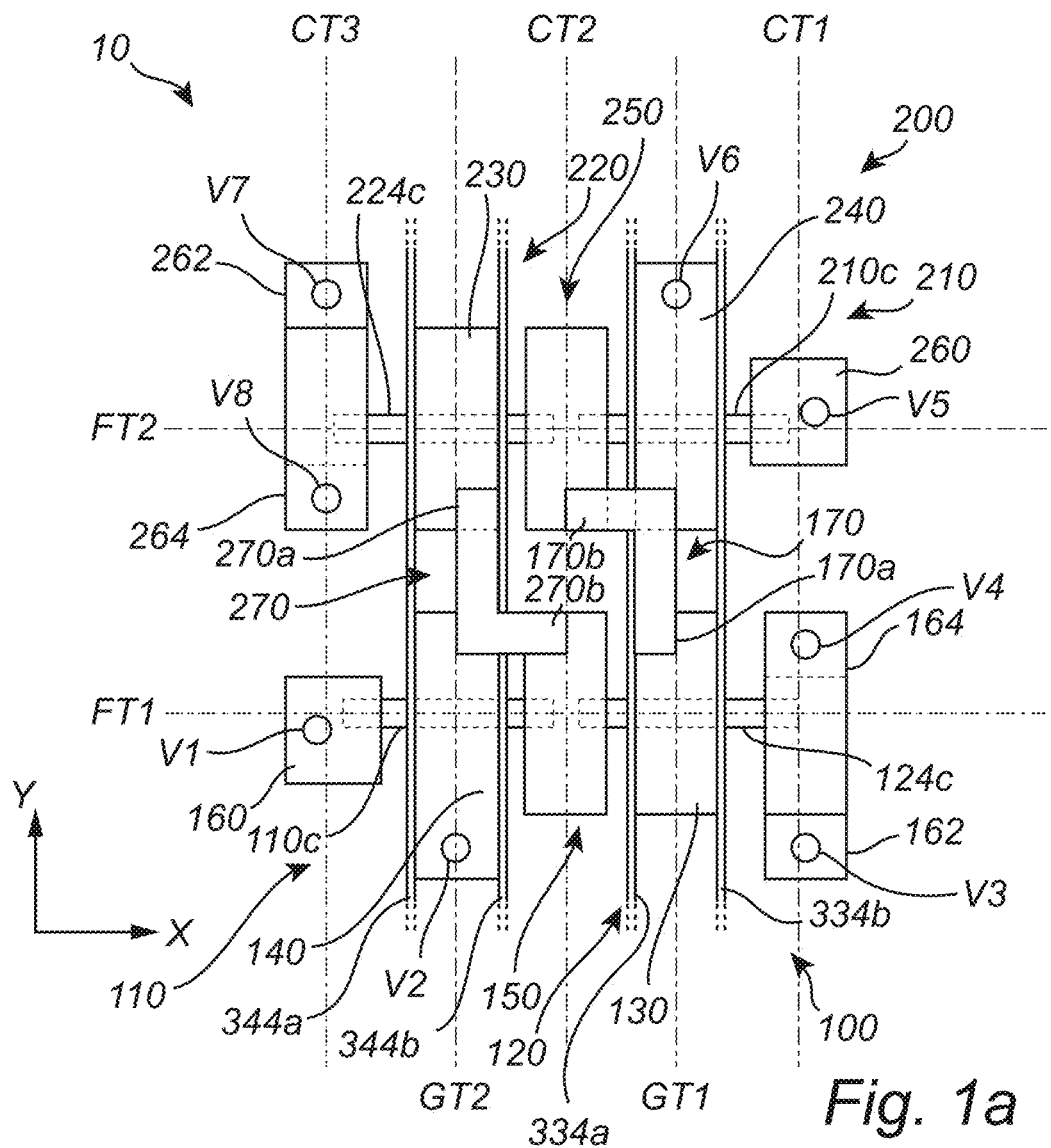
FIGS. 1a-1c are schematic views of a semiconductor device according to embodiments.
Figure 1B:
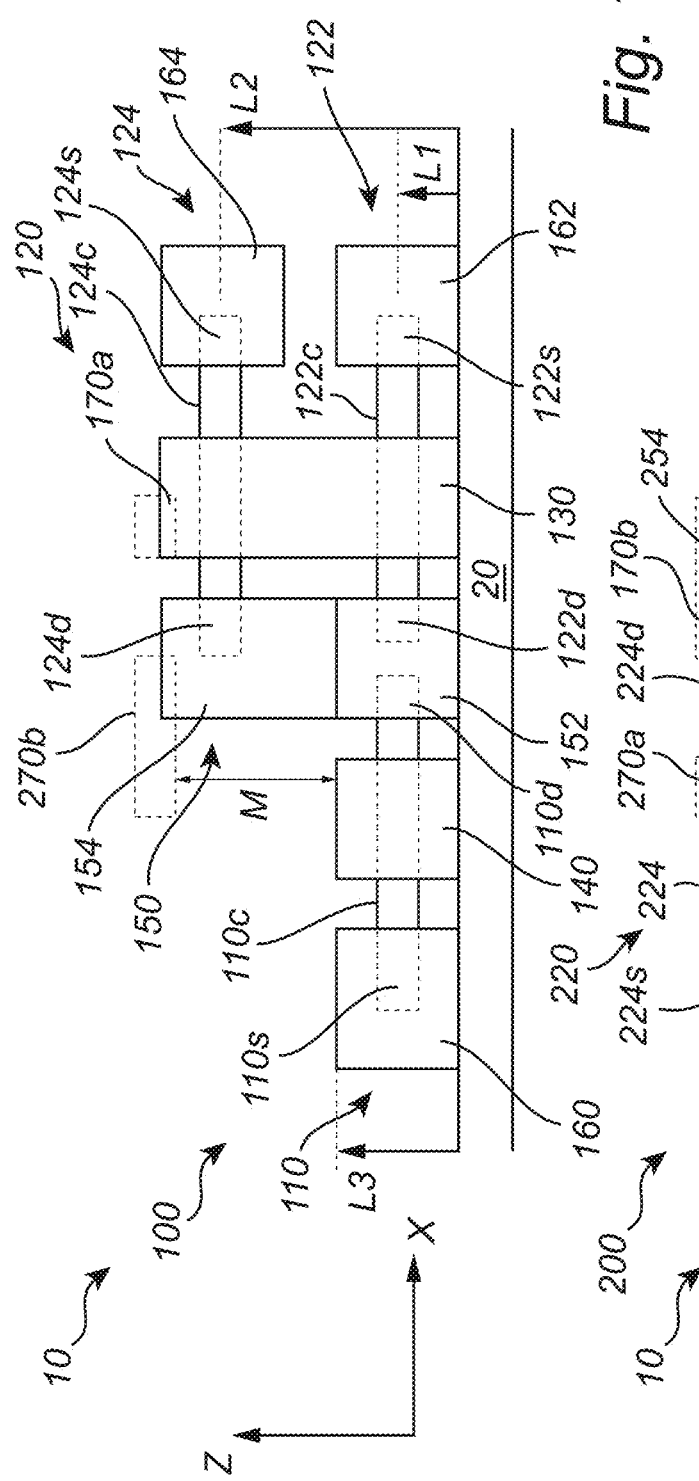
Figure 1C:
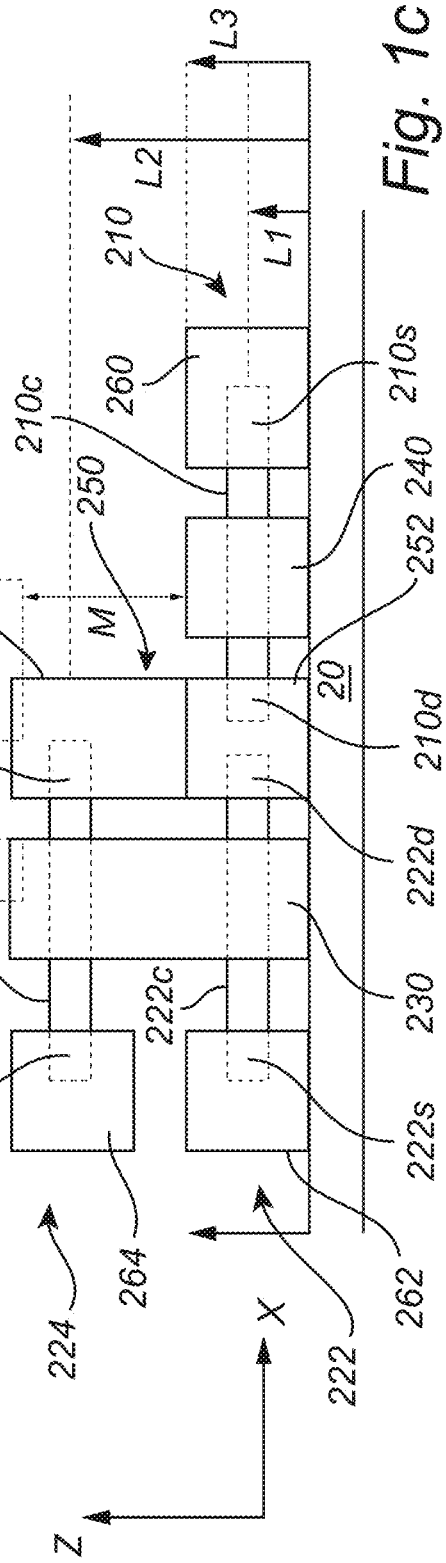

With reference to FIG. 1a there is shown a schematic top-view of a semiconductor device 10. FIG. 1b shows the device 10 along the plane of section extending along a first fin track FT1 indicated in FIG. 1a. FIG. 1c shows the device 10 along the plane of section extending along a second fin track FT2 indicated in FIG. 1a. In the figures, the indicated directions X and Y consistently respectively refer to a first horizontal direction and a second horizontal direction along a substrate 20 of the device 10. The indicated direction Z refers to a vertical direction in relation to the substrate 20. It should further be noted that, owing to the schematic nature of the drawings, the relative dimensions of the various structures and layers are not drawn to scale. Rather, the dimensions have been adapted for illustrational clarity and to facilitate understanding of the following description.

The device 10 comprises a first set of transistors 100 and a second set of transistors 200 arranged on the substrate 20. The first set of transistors 100 are distributed along the first fin track FT1. The second set of transistors 200 are distributed along the second fin track FT2. The fin tracks FT1, FT2 represent different parallel geometrical tracks or geometrical lines along which the semiconductor channels of the first and second sets of transistors 100, 200 are formed and parallel to. As will be described below, the semiconductor channels of the first and second sets of transistors 100, 200 may be formed from a first and a second semiconductor fin, respectively. Accordingly, FT1 and FT2 corresponds to the longitudinal direction of the fins from which the semiconductor channels are formed.

Further indicated in FIG. 1a are first and second gate tracks GT1, GT2. The gate tracks GT1, GT2 extend transverse to and across the fin tracks FT1, FT2. The gate tracks represent different parallel geometrical tracks or geometrical lines along which the gate electrodes of the device 10 are distributed. The gate electrodes may be formed in respective gate trenches in one or more dielectric layers embedding the device 10. Accordingly, GT1 and GT2 may be understood as representing the longitudinal directions of the gate trenches in which the gate electrodes are formed.

FIG. 1a further indicates three contact tracks CT1-CT3. The contact tracks CT1-CT3 extend transverse to and across the fin tracks FT1, FT2. The contact tracks CT1-CT3 are parallel to the gate tracks GT1, GT2. The contact tracks represent different parallel geometrical tracks or geometrical lines along which the source/drain contacts of the device 10 are arranged. The source/drain contacts may be formed in respective contact trenches in one or more dielectric layers embedding the device 10. Accordingly, CT1-CT3 may be understood as representing the longitudinal directions of the contact trenches in which the source/drain contacts are formed.

A first pair of gate trench spacers 334a, 334b may as shown extend on opposite sides of and along the first gate track GT1. A second pair of dielectric sidewall spacers 344a, 344b may extend on opposite sides of and along the second gate track GT2. The gate trench spacers 334a, 334b, 344a, 344b are hence arranged between a respective gate track and a respective contact track. The gate trench spacers 334a, 334b, 344a, 344b separate the gate trenches from the contact trenches.

In FIGS. 1a-1c, the various gate electrodes and source/drain contacts are schematically shown to be arranged on the substrate 20. However, as may be appreciated one or more isolating or dielectric layers or similar may be present between the substrate 20 and the structures arranged thereon to provide electrical isolation between the main surface of the substrate 20 and the gate electrodes and source/drain contacts. Further, the structures formed on the substrate 20 may be embedded in one or more dielectric layers, but have been omitted from the drawings for illustrational clarity.

The illustrated portion of the device 10 may correspond to one functional cell in an array of a plurality of corresponding functional cells, for instance an array of identical bits cell or some other logic cell. Hence, the device 10 may comprise a plurality of regularly spaced and parallel fin tracks, a plurality of regularly spaced and parallel gate tracks, and a plurality of regularly spaced and parallel contact tracks. The tracks may together define a regular grid. The gate electrodes may be disposed at the intersections between the fin tracks and the gate tracks. The source/drain contacts may be disposed at the intersections between the fin tracks and the contact tracks. The semiconductor channels of the transistors may extend along the fin tracks, between source/drain contact pairs.

Referring to FIGS. 1a-1c, the first set of transistors 100 comprises a first pass transistor 110 and a first stacked complementary transistor pair 120. The first complementary transistor pair 120 comprises a lower transistor 122 and an upper transistor 124. The second set of transistors 200 comprises a second pass transistor 210 and a second stacked complementary transistor pair 220. The second complementary transistor pair 220 comprises a lower transistor 222 and an upper transistor 224.

The first pass transistor 110 and the second transistor pair 220 are arranged directly opposite each other, along the first and second fin track FT1, FT2, respectively. The second pass transistor 210 and the first transistor pair 120 are arranged directly opposite each other, along the second and first fin track FT2, FT1, respectively.

The first and second pass transistors 110, 210 may be n- or p-type FETs, such as an nMOSFET or pMOSFET. The first and second transistor pairs 120, 220 may each comprise a pair of an n- and a p-type FET, such as an nMOSFET and a pMOSFET. Either the lower transistor 122, 222 or the upper transistor 124, 224 of each pair 120, 220 may be the n-type or p-type FET and the other one may be of the opposite type. Hence, the first and complementary transistor pairs 120, 220 may form a respective CMOS transistor pair.

The first transistor pair 120 comprises a first "tall" gate electrode 130. The second transistor pair 220 comprises a second "tall" gate electrode 230. The first pass transistor 110 comprises a first "short" gate electrode 140. The second pass transistor 210 comprises a second "short" gate electrode 240. The first tall gate electrode 130 and the second short gate electrode 240 are arranged along the first gate track GT1. The second tall gate electrode 230 and the first short gate electrode 140 are arranged along the second gate track GT2.

The drain region 110d of the first pass transistor 110 and the drain regions 122d, 124d of the first transistor pair 120 are connected to a first drain contact arrangement 150. The drain region 210d of the second pass transistor 210 and the drain regions 222d, 224d of the second transistor pair 220 are connected to a second drain contact arrangement 250.

The first tall gate electrode 130 is connected to the second contact arrangement 250 by a first cross-couple contact 170. The second tall gate electrode 230 is connected to the first contact arrangement 150 by a second cross-couple contact 270. The second short gate electrode 240 is recessed to create a clearance for the first cross-couple contact 170 to run horizontally over the second short gate electrode 240. The first short gate electrode 140 is recessed to create a clearance for the second cross-couple contact 270 to run horizontally over the first short gate electrode 140.

Although reference herein is made to "drain region"/ "source region" and "drain contact"/"source contact" of a transistor it should be noted that the actual function of the region/contact may depend on the direction of the current flowing through the transistor. Hence, "drain" and "source" should be construed broadly as mere labels for the two different regions/contacts of a transistor. Hence, reference to a "drain" region of a transistor may be interpreted as reference to a "first source/drain" region of the transistor and reference to a "source" region of the transistor may be interpreted as a reference to a "second source/drain" region of the transistor, and correspondingly for "source" contact and "drain" contact.

The first pass transistor 110 comprises a first pass transistor semiconductor channel 110c. For brevity, a "semiconductor channel" may in the following simply be referred to as a "channel". The first pass transistor channel 110c extends between a source region 110s and a drain region 110d of the first pass transistor 110. The channel 110c extends along and coincides horizontally with the first fin track FT1. The channel 110c is arranged at a first level L1 above the substrate 20. The channel 110c and/or the source and drain regions 110s, 110d may be doped to in accordance with the intended type of transistor device (i.e. n-type or p-type).

The first short gate electrode 140 is configured as a gate for the first pass transistor channel 110c. The first short gate electrode 140 wraps around the first pass transistor channel 110c. The first short gate electrode 140 is arranged at the intersection between the first fin track FT1 and the second gate track GT2. The first short gate electrode 140 is arranged between the second pair of gate trench spacers 344a, 344b. A gate dielectric may interpose the gate electrode 140 and the channel 110c. The first short gate electrode 140 has a vertical height above the substrate 20 which is smaller than a vertical height of the first tall gate electrode 130. An upper surface of the short gate electrode 140 is arranged at a third level L3 below the second level L2 and above the first level L1.

The source region 110s of the first pass transistor 110 is connected to a source contact 160. The source contact 160 wraps around the source region 110s. The source contact 160 is arranged at the intersection between the first fin track FT1 and the third contact track CT3. The drain region 110d is connected to a first lower drain contact part 152 of the first contact arrangement 150. The lower drain contact part 152 wraps around the drain region 110d. The lower drain contact part 152 is arranged at the intersection between the first fin track FT1 and the second contact track CT2.

The first lower transistor 122 of the first transistor pair 120 comprises a first lower channel 122c. The upper transistor 124 of the first transistor pair 120 comprises a first upper channel 124c. The first lower channel 122c extends between a source region 122s and a drain region 122d of the first lower transistor 122. The lower channel 122c extends along and coincides horizontally with the first fin track FT1. The lower channel 122c is arranged at the first level L1, i.e., the same vertical level as the first pass transistor channel 110c. The first upper channel 124c extends between a source region 124s and a drain region 124d of the first upper transistor 124. The upper channel 124c extends along and coincides horizontally with the first fin track FT1. The upper channel 124c is arranged directly above the lower channel 122c, at a second level L2 above the substrate 20 and above the first level L1. The channels 122c, 124c and/or the source and drain regions 122s, 124s, 122d, 124d may be doped in accordance with the intended type of transistor device (i.e. n-type or p-type), i.e. such that a stack of a lower n-type transistor 122 and an upper p-type transistor 124, or vice versa, may be formed.

The first tall gate electrode 130 is configured as a common gate for the first lower and upper transistor channels 122c, 124c. The first tall gate electrode 130 wraps around the first lower and upper transistor channels 122c, 124c. Accordingly, the tall gate electrode 130 is configured to control the conductivity of the lower and upper channels 122c, 124c. The tall gate electrode 130 may as shown be formed in a pillar-shape, extending vertically between the first lower and upper transistor channels 122c, 124c. The first tall gate electrode 130 is arranged at the intersection between the first fin track FT1 and the first gate track GT1. The first tall gate electrode 130 is arranged between the first pair of gate trench spacers 334a, 334b. A gate dielectric may interpose the gate electrode 130 and the respective channels 122c, 124c.

The drain regions 122d, 124d of the lower and upper transistors 122, 124 are connected to the first contact arrangement 150. More specifically, the drain region 122d is connected to the first lower drain contact part 152 which wraps around the drain region 110d. The lower drain contact part 152 wraps around the drain region 122d. The drain region 124d is connected to a first upper drain contact part 154 of the first contact arrangement 150. The upper drain contact part 154 wraps around the drain region 124d. The upper drain contact part 154 is, like the lower drain contact part 152, arranged at the intersection between the first fin track FT1 and the second contact track CT2.

The source regions 122s, 124s of the upper and lower transistors 120, 124 are connected to a respective first lower and upper source contact 162, 164. The first lower source contact 162 wraps around the source region 122s. The first upper source contact 164 wraps around the source region 124s. The first lower and upper source contacts 162, 164 are arranged at the intersection between the first fin track FT1 and the first contact track CT1.

The above description of the first set of transistors 100, the gate electrodes 130, 140 and the contacts 150, 160, 162, 164 arranged along the first fin track FT1 applies correspondingly to the second set of transistors 200, the gate electrodes 230, 240 and the contacts 250, 260, 262, 264 arranged along the second fin track FT2.

Accordingly, whereas the channels of the first set of transistors extend along and coincides horizontally with the first fin track FT1, the channels of the second set of transistors 200 extend along and coincides horizontally with the second fin track FT2. The second tall gate electrode 230 is arranged at the intersection between the second fin track FT2 and the second gate track GT2. The second tall gate electrode 230 is arranged between the second pair of gate trench spacers 344a, 344b. The second tall gate electrode 230 and the first short gate electrode 140 are arranged directly opposite each other, along the second and first fin track FT2, FT1, respectively. The second short gate electrode 240 is arranged at the intersection between the second fin track FT2 and the first gate track GT1. The second short gate electrode 240 is arranged between the first pair of gate trench spacers 334a, 334b. The second short gate electrode 240 and the first tall gate electrode 130 are arranged directly opposite each other, along the second and first fin track FT2, FT1, respectively. The second short gate electrode 240 has a vertical height above the substrate 20 which is smaller than a vertical height of the second tall gate electrode 230. An upper surface of the second short gate electrode 240 is arranged at the third level L3 below the second level L2 and above the first level L1. The second contact arrangement 250 comprises a second lower drain contact part 252 and a second upper drain contact part 254 arranged at the intersection between the second fin track FT2 and the second contact track CT2. In other words, the first contact arrangement 150 and the second contact arrangement 250 are arranged directly opposite each other, along the first and second fin track FT1, FT2, respectively.

As may be seen in FIG. 1a, the first cross-couple contact 170 comprises a first end 170a, a second end 170b and a body 170c extending between the first and second end 170a, 170b. The first end 170a is arranged in contact with the first tall gate electrode 130 at a first interface. Hence, the first end 170a and the first tall gate electrode 130 are arranged in mutual abutment at the first interface. The second end 170b is arranged in contact with the second contact arrangement 250 at a second interface. Hence, the second end 170b and the second contact arrangement 250 are arranged in mutual abutment at the second interface. More specifically, the second end 170b is arranged in contact with the second upper contact part 254 of the second contact arrangement 250. The body 170c extends from the first interface to the second interface in a horizontal path running above the second short gate electrode 240. More specifically, the horizontal path extends in a horizontal plane intersected by the first tall gate electrode 130 and the second contact arrangement 250. In this horizontal plane, the horizontal path extends from the first interface, in a direction along the first gate track GT1, to a horizontal position directly above the second short gate electrode 240. From this horizontal position, the horizontal path extends to the second interface. Thus, the first cross-couple contact 170 extends through the gate trench spacer 334a which is arranged between the first gate track GT1 and the contact trench comprising the second contact arrangement 250.

Correspondingly, the second cross-couple contact 270 comprises a first end 270a, a second end 270b and a body 270c extending between the first and second end 270a, 270b. The first end 270a is arranged in contact with the second tall gate electrode 230 at a first interface. Hence, the first end 270a and the second tall gate electrode 230 are arranged in mutual abutment at the first interface. The second end 270b is arranged in contact with the first contact arrangement 150 at a second interface. Hence, the second end 270b and the first contact arrangement 150 are arranged in mutual abutment at the second interface. More specifically, the second end 270b is arranged in contact with the first upper contact part 154 of the first contact arrangement 150. The body 270c extends from the first interface to the second interface in a horizontal path running above the first short gate electrode 140. More specifically, the horizontal path extends in a horizontal plane intersected by the second tall gate electrode 230 and the first contact arrangement 150. In this horizontal plane, the horizontal path extends from the first interface, in a direction along the second gate track GT2, to a horizontal position directly above the first short gate electrode 140. From this horizontal position, the horizontal path extends to the second interface. Thus, the second cross-couple contact 270 extends through the gate trench spacer 344b which is arranged between the second gate track GT2 and contact trench comprising the first contact arrangement 150.

The shorter height L3 of the first and second short gate electrodes 140, 240 provides a vertical isolation margin between the first/second cross-couple contact 170/270 and the second/first short gate electrodes 240/140. This is schematically indicated by "M" in FIGS. 1b and 1c wherein the respective first and second ends 170a, 170b, 270a, 270b of the cross-couple contacts 170, 270 has been indicated by dashed lines (although they do not extend through the planes viewed in FIGS. 1b, 1c).

In the illustrated design, the first cross-couple contact 170 presents a horizontal extension along direction Y such that it does not overlap the second fin tracks FT2. However, it is also possible to form the first cross-couple contact 170 with a horizontal extension such that the first cross-couple contact does overlap the second fin track FT2. This applies correspondingly to the extension of the second cross-couple contact 270 with respect to the first fin track FT1.

As schematically indicated in FIG. 1a, the device 10 may further comprise a set of vertical interconnects/conductive vias V1-V4. By the vias, source/drain contacts and the gate electrodes may be connected (e.g., tapped) to respective signal lines or supply rails arranged in interconnection levels or wiring levels arranged above the transistor level, e.g., in the back end of line of the device 10. For instance, a first via V1 may connect the first source contact 160 of the first pass transistor 110 to a first signal line. A second via V2 may connect the first short gate electrode 140 to a second signal line. A third via V3 may connect the first lower source contact 162 to a first supply rail. A fourth via V4 may connect the first upper source contact 164 to a second supply rail. To facilitate contacting the lower source contact 162 with the via V3, the lower source contact 162 may protrude horizontally by a distance from the first fin track FT1, and horizontally beyond the upper source contact 164. Alternatively, the via V3 may connect the lower source contact 162 to a buried power rail. Similarly, to facilitate contacting the upper source contact 164 with the via V4, the upper source contact 162 may protrude horizontally by a distance from the first fin track FT1. A corresponding set of vias V5-V8 may be provided for the second set of transistors 200.

Figure 2:
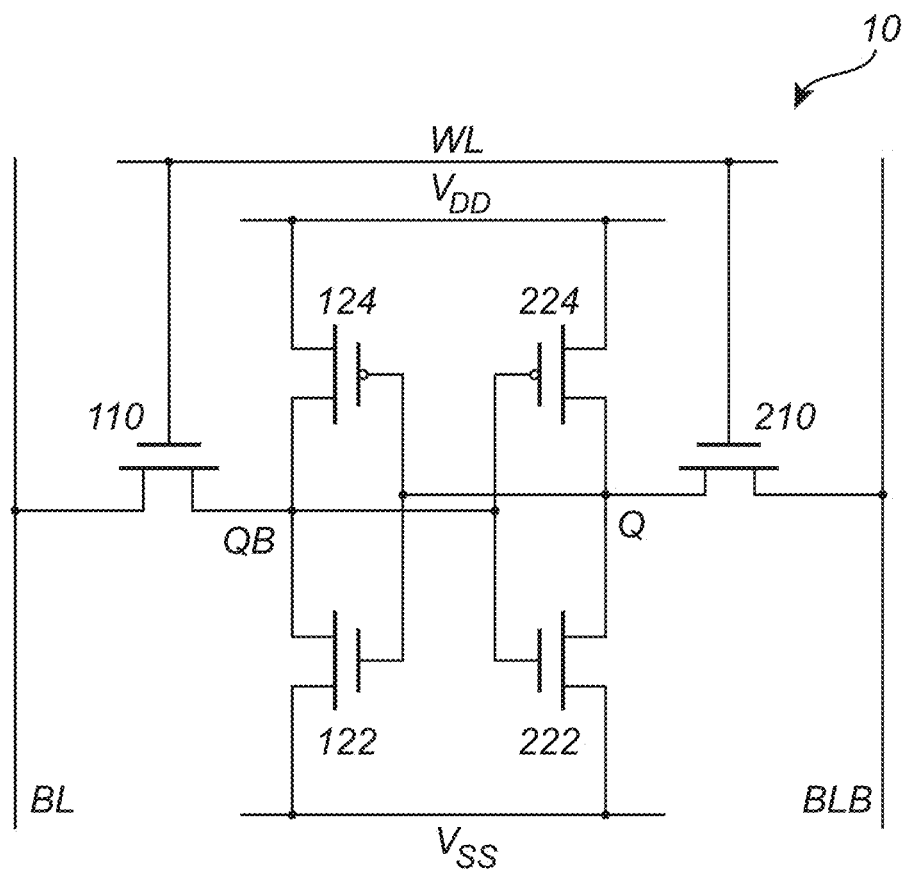
FIG. 2 is a circuit diagram of a semiconductor device.

FIG. 2 shows one example circuit diagram of the device 10. FIG. 2 shows the device 10 implemented as an SRAM bit cell and accordingly includes signal lines in the form of complementary bit lines BL and BLB and a word line WL as well as power supply rails VDD and VSS. The cross-coupling of the gate of the first complementary pair of transistors 122, 124 to the drains of the second complementary pair of transistors 222, 224 is achieved by the cross-couple contact 170 interconnecting the first tall gate electrode 130 and the second contact arrangement 250, as disclosed above. Correspondingly, the cross-coupling of the gate of the second complementary pair of transistors 222, 224 to the drains of the first complementary pair of transistors 122, 124 is achieved by the cross-couple contact 270 interconnecting the second tall gate electrode 230 and the first contact arrangement 150, as disclosed above. As may be understood from FIG. 2, the pass transistors 110, 210 may form respective pass gate devices (PGs). The lower transistors 122, 222 of the first and second transistor pairs 120, 220 may form respective pull-up devices (PUs). The upper transistors 124, 224 of the first and second transistor pairs 120, 220 may form respective pull-down devices (PDs). Alternatively, the lower transistors 122, 222 of the first and second transistor pairs 120, 220 may form respective PDs and the upper transistors 124, 224 of the first and second transistor pairs 120, 220 may form respective PUs. Although the SRAM bit cell shown in FIG. 2 is a 6-transistor (6T) SRAM bit cell it should be noted that the design with the cross-couple contacts and the short and tall gate electrodes also may be used in corresponding 8-transistor (8T) and 10-transistor (10T) SRAM bit cell designs.

In the above a device in accordance with the inventive concept has mainly been described with reference to a limited number of examples. However, as is readily appreciated by a person skilled in the art, other examples than the ones disclosed above are equally possible within the scope of the inventive concept, as defined by the appended claims.

For instance, in FIGS. 1a-1c, the transistor channels and source/drain regions of the first and second sets of transistors 100, 200 are formed in nanowire-shaped semiconductor structures with a height to width ratio being close to one. However, other designs are also possible, such as nanosheets having a lateral dimension greater than a thickness dimension, or a thickness dimension greater than a lateral dimension. It is also possible to form one or more of the transistor channels of the first and second transistor sets 100, 200 in fin-shaped semiconductor structures. For instance, the pass transistor channels 110c, 210c and/or lower transistor channels 122c, 222c may be formed in fin-shaped semiconductor structures protruding above the substrate 20 with the upper transistor channels 124c, 224c formed in nanowires suspended above the fin-shaped semiconductor structures. Further, the gate electrodes and/or source/drain contacts need not be formed as wrap-around electrodes/contacts, i.e. completely enclosing the semiconductor structures. For instance, one or more of the gate electrodes may extend along or abut the semiconductor structure along a portion of a peripheral surface of the respective structure. For instance, both tri-gate and dual-gate designs are possible: The pass transistor channels 110c, 210c and/or lower transistor channels 122c, 222c may be formed in fin-shaped semiconductor structures and the upper transistor channels 124c, 224c may be formed in nanowires separated from the underlying fin-shaped semiconductor structure by a thin insulating layer. Accordingly, a short gate electrode may extend along the side walls of the fin-shaped pass transistor channel. A tall gate electrode may extend along the side walls of the fin-shaped lower transistor channel and along the sidewalls and upper surface of the nanowire-shaped upper transistor channel. This may apply correspondingly to one or more of the source/drain contacts.

Additionally, in the illustrated device implementation, the cross couple contacts 170, 270 run above the second/first short gate electrodes 240/140. However, at relaxed fin pitches it is also possible to form the cross couple contacts 170, 270 to extend from the respective tall gate electrodes 130, 230 to the respective contact arrangements 250, 150 without passing over the short gate electrodes 240, 140. The clearance above the shorter gate electrodes 240, 140 may still be beneficial by enabling a reduced capacitive coupling between the gate electrodes 240, 140 and the cross couple contacts 170, 270.

A method for forming a semiconductor device, corresponding to the semiconductor device 10, will now be described with reference to various intermediate structures illustrated in FIGS. 3a-3m. In the following disclosure, features corresponding to features shown in FIGS. 1a-1c will be similarly numbered unless stated otherwise.

FIG. 3a shows in perspective a section of a semiconductor substrate 20. The illustrated section of the substrate 20 may correspond to a section in which a functional cell is to be formed, such as a logic cell or an SRAM bit cell. It will be appreciated that neighboring sections of the substrate 10 outside of the shown region may present a similarly structure and be processed in a corresponding manner as the illustrated section, in order to provide a plurality of similarly configured cells in parallel.

The substrate 10 may be a conventional semiconductor substrate such as a silicon (Si) substrate, a germanium (Ge) substrate, a silicon germanium (SiGe) substrate, a silicon on insulator (SOI) substrate, a germanium on insulator (GeOI) substrate, or a SiGe on insulator (SiGeOI) substrate, to name a few examples.

The method comprises forming of semiconductor channels for a first and a second set of transistors 100, 200. With reference to the perspective view in FIG. 3a, forming of the semiconductor channels comprises forming first and second semiconductor fins 310, 320 on the semiconductor substrate 20. The first and second semiconductor fins 310, 320 extend along the first and second fin track FT1, FT2, respectively. The first and second semiconductor fins 310, 320 protrude above the substrate 20.

Each of the first and second semiconductor fins 310, 320 comprises a stack of layers comprising, in a bottom-up direction, a lower sacrificial layer 311, 321, a lower semiconductor layer 312, 322, an intermediate sacrificial layer 313, 323 and an upper semiconductor layer 314, 324. The fins 310, 320 may be formed by forming a stack of epitaxially grown layers on the substrate 20 using suitable deposition techniques, for instance chemical vapor deposition (CVD) or atomic layer deposition (ALD). The fins 310, 320 may then be formed by etching trenches in the layer stack. The trenches may be formed using conventional patterning techniques such as single-patterning techniques, or multiple-patterning techniques, e.g. self-aligned double patterning (SADP) or quadruple patterning (SAQP). By way of example, a fin spacing may be on the order of a few tens of nm, such as about 10-50 nm.

The lower semiconductor layers 312, 322 and the upper semiconductor layers 314, 324 may comprise or consist of Si, SiGe or Ge. The lower sacrificial layers 311, 321 and the intermediate sacrificial layers 313, 323 may comprise or consist of a semiconductor material different from the lower and upper semiconductor layers 312, 322, 314, 324. For instance, the lower and upper semiconductor layers 312, 322, 314, 324 may be Si-layers and the lower and intermediate sacrificial layers 311, 321, 313, 323 may be SiGe-layers. However, in some other embodiments, the lower sacrificial layers 311, 321 and the intermediate sacrificial layers 313, 323 may be formed with a dielectric material. For instance, the fins 310, 320 may also be formed such that the sacrificial layers 311, 321, 313, 323 are formed of an oxide. For instance, the fins 310, 320 may be formed by patterning a silicon-on-insulator (SOI) stack comprising a lower oxide sacrificial layer, a lower semiconductor layer, an intermediate oxide sacrificial layer and an upper semiconductor layer.

An insulating layer may be formed in the trenches on opposite sides of the respective fins 310, 320 to form a trench isolation, for instance shallow trench isolation (STI). The first and the second fins 100, 200, may as shown have a same height above the substrate 20 (and/or the trench isolation).

Although the illustrated fins 310, 320 comprise lower sacrificial layers 311, 321 these layers may be omitted. For instance, this may be beneficial if the lower transistors are to be formed with fin-shaped channels rather than nanowire-shaped channels. In such a case, doped wells may be formed in the substrate 20 below the fins 310, 320 for isolating the channels from the substrate 20.

In FIG. 3b, the upper semiconductor layer 314 has been selectively removed (or "cut") along a horizontal first portion 310A of the first fin 310. The upper semiconductor layer 324 has been selectively removed along a horizontal first portion 320A of the second fin 320. Hence, the first fin 310 protrudes by a first height h1 above the substrate 20 along the first portion 310A and by a second height h2 above the substrate 20, greater than the first height h1, along a horizontal second portion 310B of the first fin 310. Correspondingly, the second fin 320 protrudes by the first height h1 above the substrate 20 along the first portion 320A and by the second height h2 above the substrate 20 along a horizontal second portion 320B of the second fin 320. The first portion 310A of the first fin 310 is the portion along which a first pass transistor semiconductor channel is to be formed. The second portion 310B of the first fin 310 is the portion along which first lower and upper semiconductor channels are to be formed. The first portion 320A of the second fin 320 is the portion along which a second pass transistor semiconductor channel is to be formed. The second portion 320B of the second fin 320 is the portion along which second lower and upper semiconductor channels are to be formed.

The cutting of the fins 310, 320 may be performed by covering the fins 310, 320 by a temporary layer. The temporary layer may for instance be a spin-on-layer, for instance spin-on-carbon or some other conventional organic planarization layer. A fin cut mask may be formed on the temporary layer having openings above the first portions 310A, 320A of the fins 310, 320. The temporary layer may then be etched through the openings and into the upper semiconductor layers 314, 324 of the fins 310, 320. The etch may stop at lower semiconductor layers 312, 322 of the fins 310, 320. The fin cut mask may for instance be a resist-based mask or a hard mask. Any suitable dry etching process may be used, for instance an HBr-based dry etch. However, a wet etching process may also be possible. For instance, a Si-based fin may be etched using a tetramethyl ammonium hydroxide (TMAH) wet etch. After the fins 310, 320 have been cut the fin cut mask and the temporary layer may be removed to expose the structure as shown in FIG. 3b.

Figure 3C:
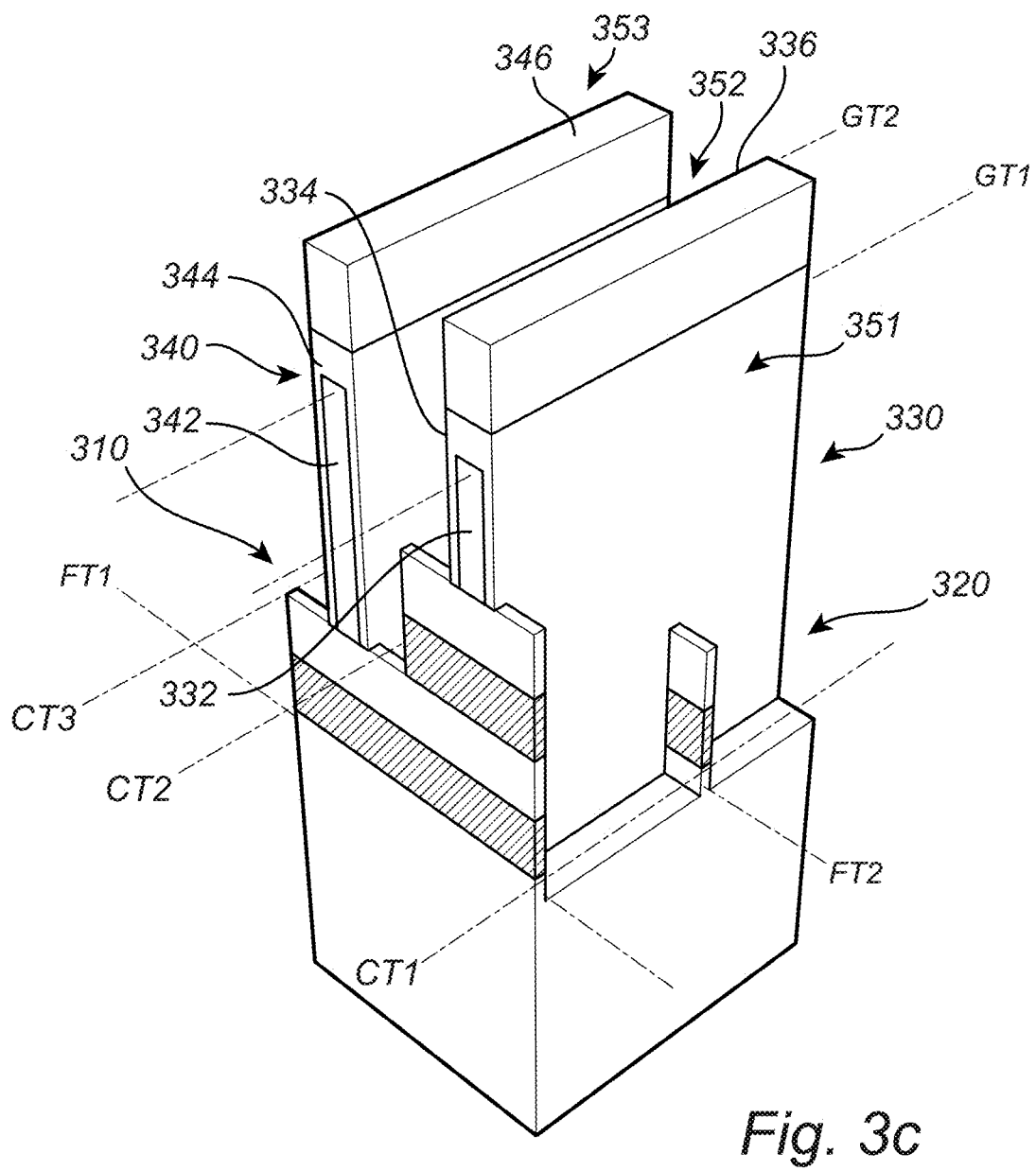

In FIG. 3c, first and second sacrificial or dummy gates 332, 342 have been formed to extend along first and second gate tracks GT1, GT2, respectively. The first and second sacrificial or dummy gates 332, 342 extend across the first and second fin tracks FT1, FT2, and accordingly also across the first and second fins 310, 320. The sacrificial or dummy gates 332, 342 may be formed by depositing a layer of a sacrificial or dummy gate material covering the first and second fins 310, 320. An example of a sacrificial or dummy gate material is polysilicon. The sacrificial or dummy gate material layer may be patterned to form the sacrificial or dummy gates 332, 342 as shown. The sacrificial or dummy gate material layer may be patterned using conventional single- or multiple-patterning techniques.

The sacrificial or dummy gates 332, 342 may as shown be covered or embedded by a respective spacer structure 334, 344. The spacer structure 334 comprises a portion which later will form a first pair of gate trench sidewall spacers 334a, 334b (see FIG. 3g). The spacer structure 344 comprises a portion which later will form a second pair gate trench sidewall spacers 344a, 344b (see, e.g., FIG. 3g). The spacer structures 334, 344 may be formed by an oxide layer, for instance a silicon oxide carbide layer-based layer such as SiOC, SiBCN, SiOCN or SiOBCN. A continuous spacer layer may be deposited to cover the sacrificial or dummy gates 332, 342 and subsequently patterned to obtain the structure with the two separate space structures 334, 344 shown in FIG. 3c. A respective gate cap 336, 346 (e.g., a hard mask material such as a nitride-based material for instance SiN) may remain on the sacrificial or dummy gates 332, 342 following the patterning.

The first sacrificial or dummy gate 332 with the spacer structure 334 and the gate cap 336 may in the following be referred to as the first sacrificial or dummy gate structure 330. The second sacrificial or dummy gate 342 with the second spacer structure 344 and the gate cap 346 may in the following be referred to as the second sacrificial or dummy gate structure 340. Contact trenches 351, 352, 353 extend along and adjacent to the sacrificial or dummy gate structures 330, 340. The contact trenches extend along respective contact tracks CT1-CT3.

In FIGS. 3d-3h, the left hand side shows a view of the structure along the first fin track FT1. The right hand side shows a view of the structure along the second fin track FT2.

Figures 3D, 3E:
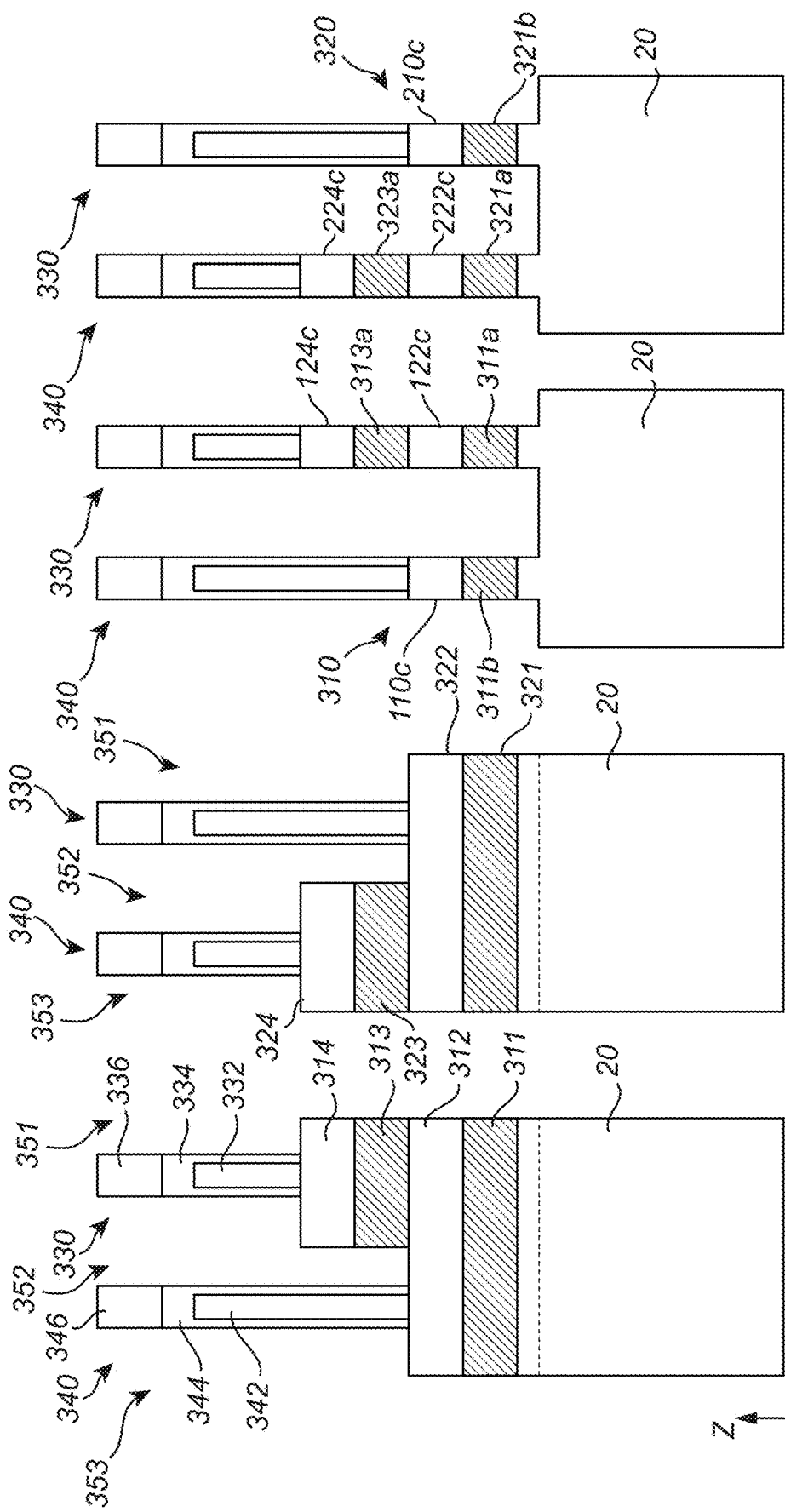

FIG. 3d shows the structure of FIG. 3c. In FIG. 3e, portions of the first fin 310 exposed by the sacrificial or dummy gate structures 330, 340 have been removed or "cut" away. The second fin 320 has been similarly cut. The fins 310, 320 may be cut by etching the fins 310, 320 while using the sacrificial or dummy gate structures 330, 340 as etch masks. Any suitable etching process may be used. Advantageously, a dry etching process, such as a HBr-based dry etching, may be used.

The lower semiconductor layer portion 110c of the first fin 310 remaining under the second gate structure 340 forms the channel of the first pass transistor 110, which is to be formed. The lower semiconductor layer portion 122c of the first fin 310 remaining under the first gate structure 330 forms the channel of the first lower transistor 120 of the first complementary transistor pair, which is to be formed. The upper semiconductor layer portion 124c of the first fin 310 remaining under the first gate structure 330 forms the channel of the first upper transistor 110 of the first complementary transistor pair, which is to be formed. As shown, portions of the first fin 310 remaining after the fin cut may also include first lower sacrificial layer portions 311a, 311b and a first intermediate sacrificial layer portion 313a.

The lower semiconductor layer portion 210c of the second fin 320 remaining under the first gate structure 330 forms the channel of the second pass transistor 210, which is to be formed. The lower semiconductor layer portion 222c of the second fin 320 remaining under the second gate structure 340 forms the channel of the second lower transistor 220 of the second complementary transistor pair, which is to be formed. The upper semiconductor layer portion 224c of the second fin 320 remaining under the second gate structure 340 forms the channel of the second upper transistor 210 of the second complementary transistor pair, which is to be formed. As shown, portions of the second fin 320 remaining after the fin cut may also include second lower sacrificial layer portions 321a, 321b and a second intermediate sacrificial layer portion 323a.

Figure 3F:
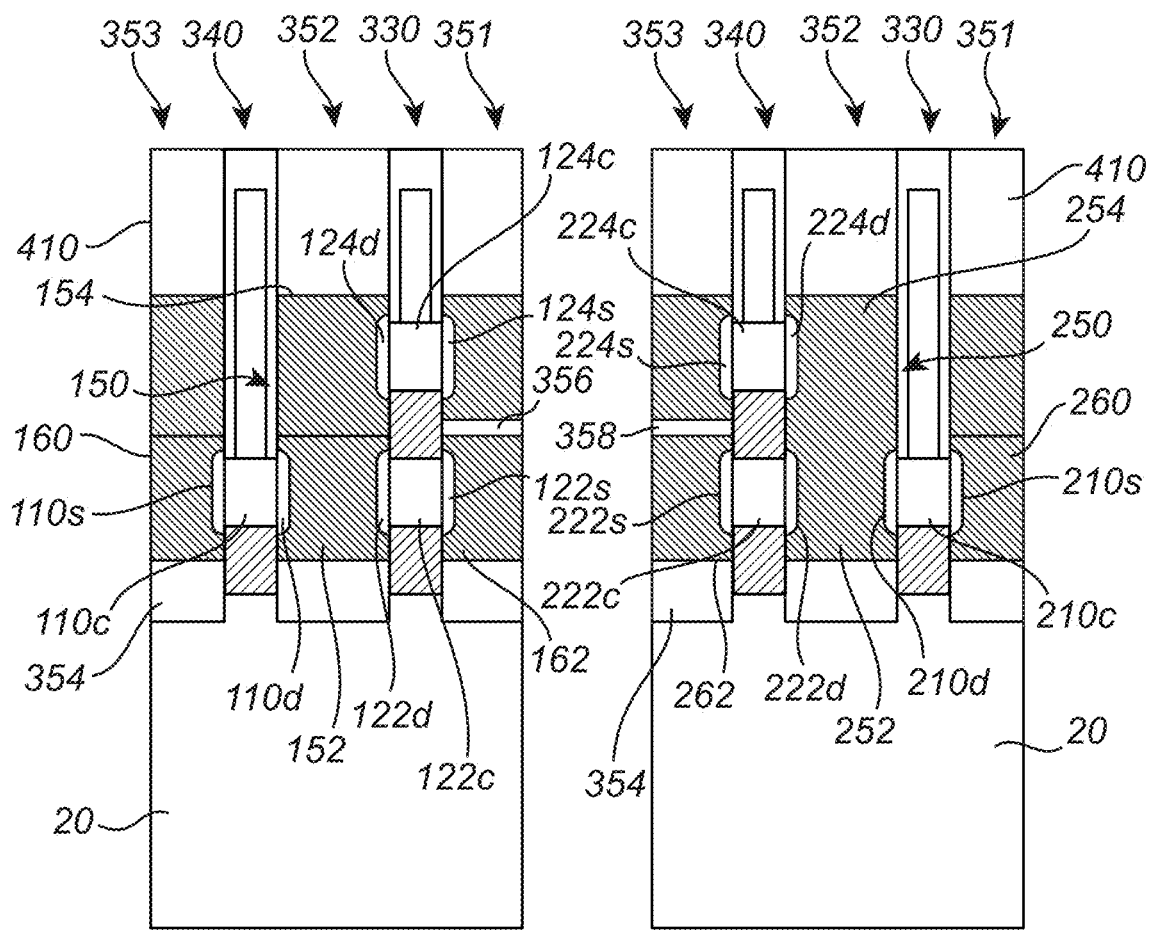

In FIG. 3f, source and drain regions 110s, 110d have been formed on exposed ends of the first pass transistor channel 110c. Source and drain regions 122s, 122d have been formed on exposed ends of the lower transistor channel 120c. Further, as shown in FIG. 3f, source and drain regions 210s, 210d have been formed on exposed ends of the first pass transistor channel 210c. Source and drain regions 222s, 222d have been formed on exposed ends of the lower transistor channel 220c These lower level source and drain regions 110s, 110d, 122s, 122d, 210s, 210d, 222s, 222d may be formed by selective epitaxy, such as selective Si epitaxy or selective SiGe epitaxy, on the exposed ends of the channels 110c, 122c, 210c, 222c. The semiconductor material may be of a same type as the material forming the channels 110c, 122c, 210c, 222c. The semiconductor material may be doped by introducing appropriate impurities in the reaction chamber during the growth process. For instance, the semiconductor material may be in-situ doped SiGe or Si. However, diffusion-based doping after the growth process may also be possible.

To prevent epitaxial growth on the upper channels 124c, 224c, during forming of the lower level source and drain regions, a temporary sidewall spacer may be formed on the sidewalls of the sacrificial or dummy gate structures 330, 340 and covering the ends of the upper channel 124c, 224c while exposing the ends of the channels 110c, 122c, 210c, 222c. The temporary sidewall spacer may be removed by a short etch after forming of the lower level source and drain regions and prior to forming lower level source and drain contacts. Alternatively, the temporary sidewall spacer may be removed after forming lower level source and drain contacts. The temporary sidewall spacer may for instance be formed by partially filing the contact trenches 351, 352, 353 with a temporary material layer up to a level intermediate the level of the lower level channels 110c, 122c, 210c, 222c and the level of the upper level channels 124c, 224c. The temporary sidewall spacer may then be formed by a conformal layer deposition followed by an anisotropic etch step to remove conformal layer portions from horizontal surfaces, including upper horizontal surfaces of the temporary material layer in the contact trenches 351, 352, 353. The temporary material layer may thereafter be removed by an etch back, thereby exposing the ends of the lower level channels 110c, 210c, 122c, 222c.

As further shown in FIG. 3f, a set of lower level source and drain contacts have been formed in the contact trenches 351, 352, 353. First and second pass transistor source contacts 160, 260 have been formed in contact with the first and second pass transistor source regions 160s, 260s, respectively. First and second lower transistor drain contacts 152, 252 have been formed in contact with the first and second lower transistor drain regions 122d, 222d, respectively. The first and second lower transistor drain contacts 152, 252 are further formed in contact with the first and second pass transistor drain regions 160d, 260d. First and second lower transistor source contacts 162, 262 have been formed in contact with the first and second lower transistor source regions 122s, 222s, respectively.

Prior to the forming of the lower level source and drain regions, a bottom isolation layer 354 may be formed in the contact trenches 351, 352, 353. The bottom isolation layer 354 may be formed to cover the bottom surface of the contact trenches 351, 352, 353, formed by the substrate 20. The bottom isolation layer 354 may be deposited by CVD, ALD or a spin-on technique. The bottom isolation layer 354 may be deposited to fill the contact trenches 351, 352, 353 and etched back to a desired thickness. The bottom isolation layer 352 may for instance be a dielectric layer such as a silicon oxide, however a SiN, or a SiCO material is also possible. The bottom isolation layer 354 may prevent epitaxial growth on the substrate 20. The bottom isolation layer 354 may also isolate the lower level source and drain contacts 160, 260, 152, 252, 162, 262 from the substrate 20.

The lower level source and drain contacts may be formed in respective contact openings formed in a contact insulating layer filling the contact trenches 351, 352, 353. Prior to the forming of the lower level source and drain regions, or at least prior to forming the set of lower level source and drain contacts, the contact insulating layer may be formed in the contact trenches 351, 352, 353. The contact insulating layer 410 is visible in for instance the perspective view of FIG. 3n. The contact insulating layer may be formed of any of the materials mentioned in connection with the bottom isolation layer 354, either a same material or a different material than the bottom isolation layer 354. The contact insulating layer may also be formed of some other low-k dielectric material. Contact openings may be formed in the contact insulating layer at positions where the lower level source and drain contacts are to be formed. Although not apparent from the sectional views of FIG. 3f, the contact openings may be provided with horizontal dimensions such that source/drain contacts with the desired horizontal dimensions are obtained. The contact openings may be formed by forming a contact opening etch mask on the contact insulating layer. The etch mask may be formed by a hard mask material, for instance a nitride-based material. Openings may be patterned in the contact opening etch mask. The openings may thereafter be transferred into the contact insulating layer to form the contact openings by etching. The etching may be stopped at the bottom isolation layer 354. The etching may be a dry etch such as a reaction ion etch (RIE) or an ion beam etch (IBE). The lower set of source and drain contacts may then be formed by depositing a conductive layer of one or more conductive materials in the contact openings. For instance, a layer of metal such as Ti, TiN, WN, or an alloy of two or more thereof, may be deposited by ALD, CVD or physical vapor deposition (PVD). Optionally, a further layer of for instance W, Co, Ni, Ru or an alloy of two or more thereof, may be deposited on top of the first deposited conductive layer. If needed, the conductive layer deposited in the contact openings may be etched back to obtain source and drain contacts of the desired height. For this purpose, any suitable etch process allowing etching a metal source/drain contact material selectively to the contact insulating layer 410 may be used. Possible examples include chlorine and chlorine/oxygen based plasmas.

After forming set of lower level source and drain contacts, a set of upper level source and drain contacts has been formed in the contact trenches 351, 352, 353. First and second upper transistor drain contacts 154, 254 have been formed in contact with the first and second upper transistor drain regions 124d, 224d, respectively. First and second upper transistor source contacts 164, 264 have been formed in contact with the first and second upper transistor source regions 124s, 224s, respectively.

The first upper drain contact 154 is formed on and in contact with the first lower drain contact 152. The first lower and first upper drain contacts 152, 154 thus form lower and upper parts of a common first drain contact arrangement 150 which interconnects the first pass transistor drain region 160d with the drain regions 122d, 124d of the first lower and upper transistors 122, 124. Correspondingly, the second upper drain contact 254 is formed on and in contact with the second lower drain contact 252. The second lower and first upper drain contacts 252, 254 thus form lower and upper parts of a common second drain contact arrangement 250 which interconnects the second pass transistor drain region 260d with the drain regions 222d, 224d of the second lower and upper transistors 222, 224.

The set of upper level source and drain contacts may be formed in a similar manner as the set of lower level source and drain contacts. That is by depositing a conductive layer in the contact openings and, if needed, performing etch back of the deposited conductive layer to obtain upper level source and drain contacts of the desired height.

Further, a source contact insulator layer 356 has been formed intermediate the first lower and upper source contacts 162, 164. A source contact insulator layer 358 has also been formed intermediate the second lower and upper source contacts 262, 264. The source contact insulator layers 356, 358 may be deposited after the set of lower level source and drain contacts has been formed and prior to forming the set of upper level source and drain contacts. The source contact insulator layers 356, 358 may for instance be deposited by CVD and thereafter, in a further lithographic and etching process, removed from the contact openings in which the first and second upper level source contacts 164, 264 are to be formed.

As shown, an upper contact level may be formed also on the first and second source contacts 160, 260 such that, in effect, taller first and source contacts 160, 260 are obtained. This may facilitate access to the source contacts 160, 260 from upper interconnection levels, e.g. by landing a respective via on the source contacts 160, 260.

Following forming of the upper and lower level source and drain contacts the contacts may be covered by an insulating layer filling any remaining space in the contact openings. The above-mentioned first deposited contact insulating layer and the second deposited insulating layer may together form a final contact insulating layer 410. The thus formed contact insulating layer 410 embeds the upper and lower level source and drain contacts. The contact insulating layer 410 extends along and between the sacrificial or dummy gates 332, 342. The insulating layer may advantageously be formed by a same material and in a similar process as the first deposited contact insulating layer, thereby forming a final contact insulating layer 410 of a homogenous material composition. However, it is in principle also possible to use a different material to form a final contact insulating layer of a composite material composition.

In any case, planarization by CMP and/or etch back may then be performed to arrive at the structure shown in FIG. 3f. The gate caps 336, 346 visible in for instance FIG. 4d may be removed at some appropriate stage, for instance prior to forming the lower level source and drain regions, or during the planarization.

Figure 3G:
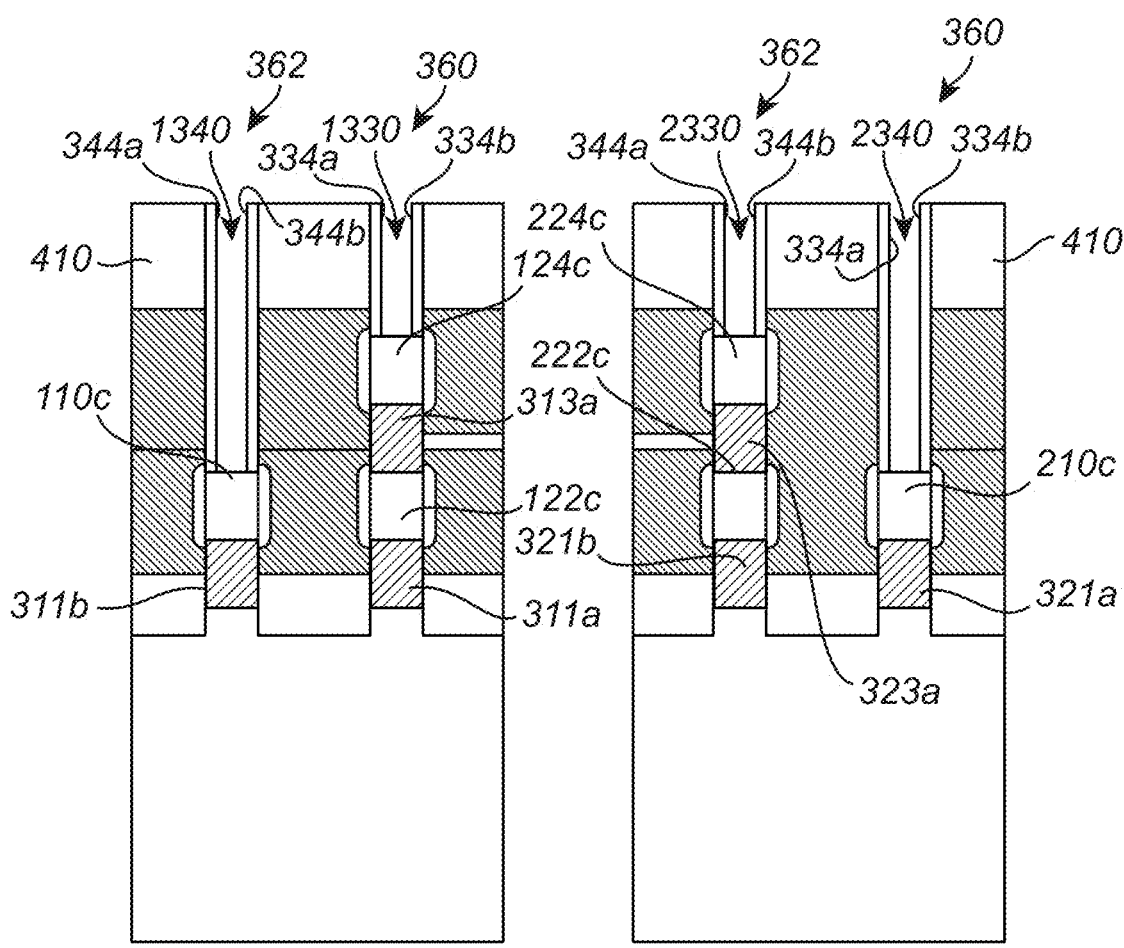

In FIG. 3g, the first and second sacrificial or dummy gates 332, 342 have been removed. Thereby, a first gate trench 360 has been formed along the first gate track GT1 and a second gate trench 362 has been formed along the second gate track GT2. The first gate trench 360 comprises as shown a first and a second gate trench section 1330, 2340 formed along the first gate track GT1. The second gate trench comprises a third and a fourth gate trench section 1340, 2330 formed along the second gate track GT2.

The first gate trench section 1330 exposes the first lower transistor channel 122c and the first upper transistor channel 124c. The second gate trench section 2340 exposes the second pass transistor channel 210c. The third gate trench section 1340 exposes the first pass transistor channel 110c. The fourth gate trench section 2330 exposes the second lower transistor channel 222c and the second upper transistor channel 224c.

As shown, the first gate trench section 1330 may further expose the lower and intermediate sacrificial layer portions 311a, 313a. The second gate trench section 2340 may expose the lower sacrificial layer portion 321a. The third gate trench section 1340 may expose the lower sacrificial layer portion 311b. The fourth gate trench section 2330 may expose the lower and intermediate sacrificial layer portions 321b, 323a.

Figure 3H:
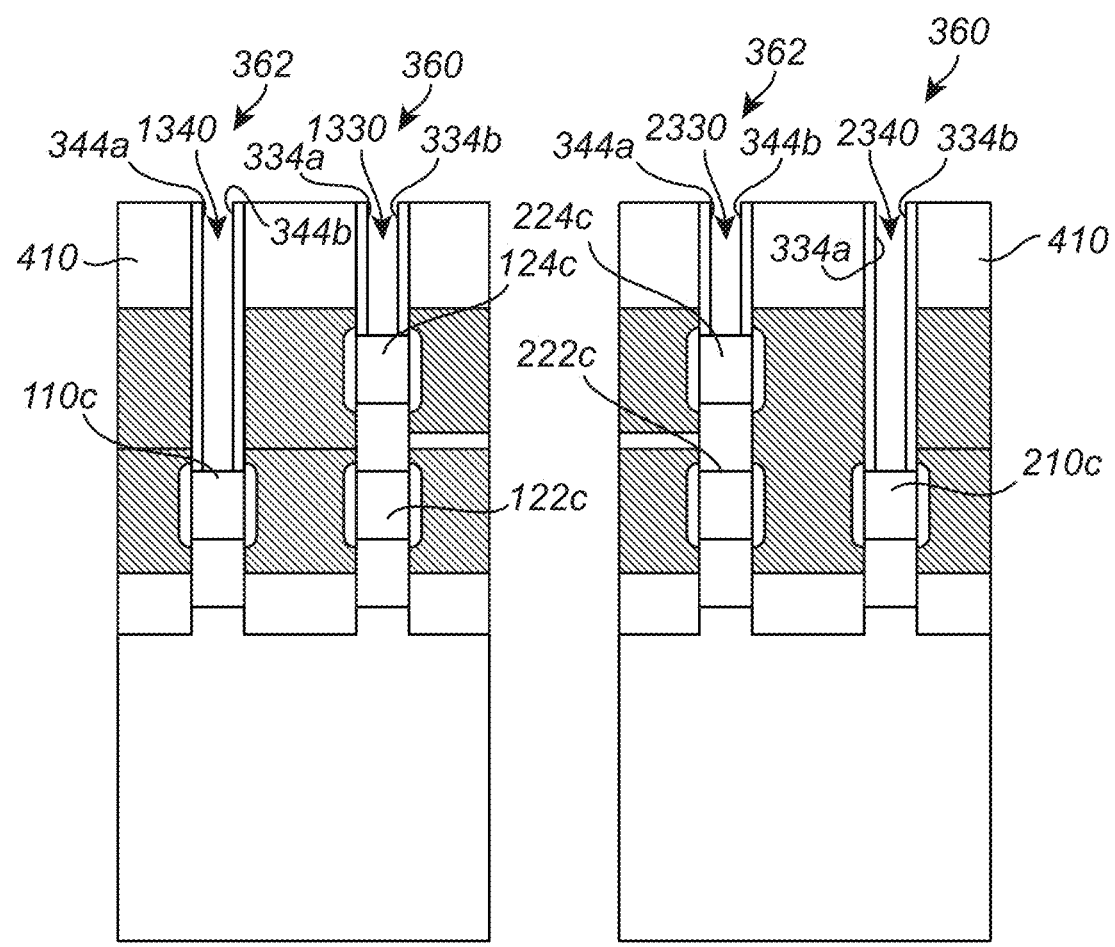

The first and second sacrificial or dummy gates 332, 342 may be removed by first exposing the upper surfaces of the dummy gates 332, 342 in an etch back process and/or a CMP process. Once exposed, the sacrificial or dummy gates 332, 342 may then be removed in an etching process tuned for selectivity towards the material forming the sacrificial or dummy gates 332, 342. The sacrificial or dummy gates 332, 342 may thereby be removed selectively from the respective first and second pairs of gate trench spacers 334a, 334b and 344a, 344b (previously forming part of the spacer structures 334, 344) and from the transistor channels exposed within the trenches. Following forming of the gate trenches 360, 362 the sacrificial layer portions 311a, 311b, 313a, 321a, 321b, 323a exposed in the gate trenches 360, 362 may be removed, thereby completely exposing (i.e. "releasing") the circumferentially extending boundary surface of the channels 110c, 122c, 124c, 210c, 222c, 224c within the trenches 360, 362, as shown in FIG. 3h. The sacrificial layer portions 311a, 311b, 313a, 321a, 321b, 323 may be removed by an etch tuned to etch the material of the sacrificial layer portions selectively from the material of the semiconductor channel portions. Such chemistries are known in the art and include, for instance, carboxylic acid/nitric acid/HF chemistry, and citric acid/nitric acid/HF chemistry, for example, which may be utilized to etch SiGe selectively to Si. Oxide-based sacrificial layer portions may be etched selectively to the semiconductor channel portions by an oxide-selective etch process.

Up until this stage of the process, the semiconductor channels may be protected by a thin oxide layer. This protective oxide layer may be removed prior to the wire release by a short oxide etch within the gate trenches 360, 362.

Figure 3I:
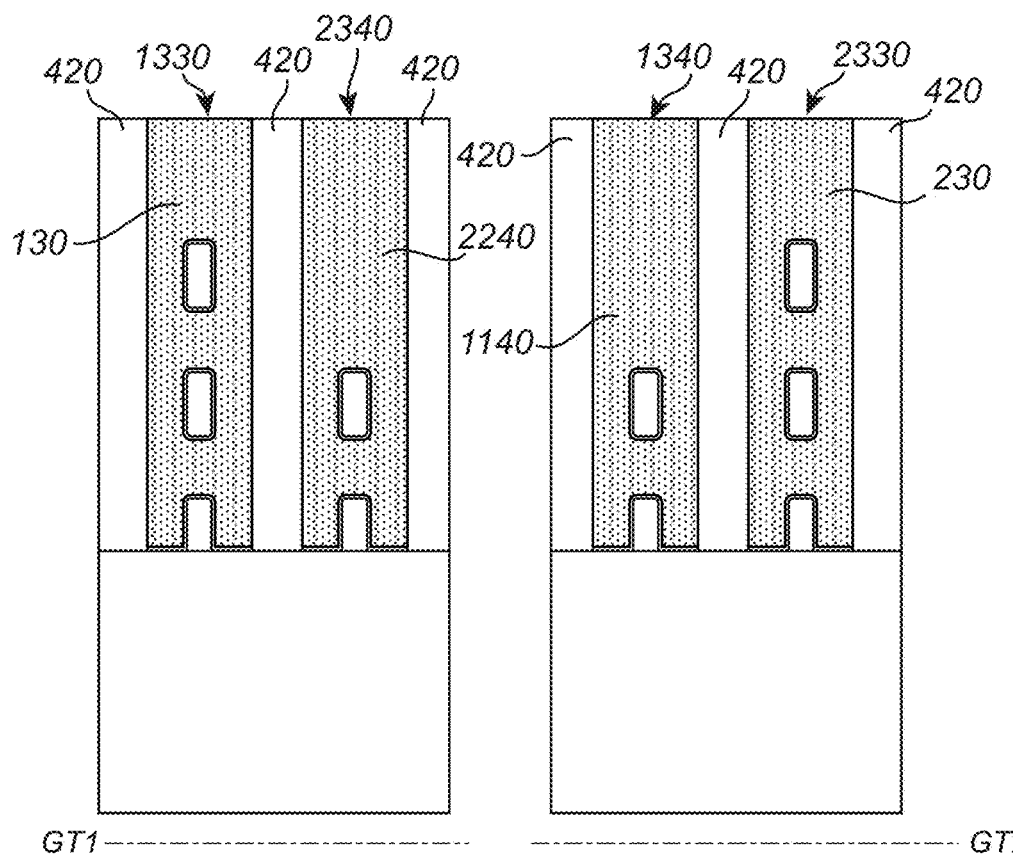
Figure 3J:
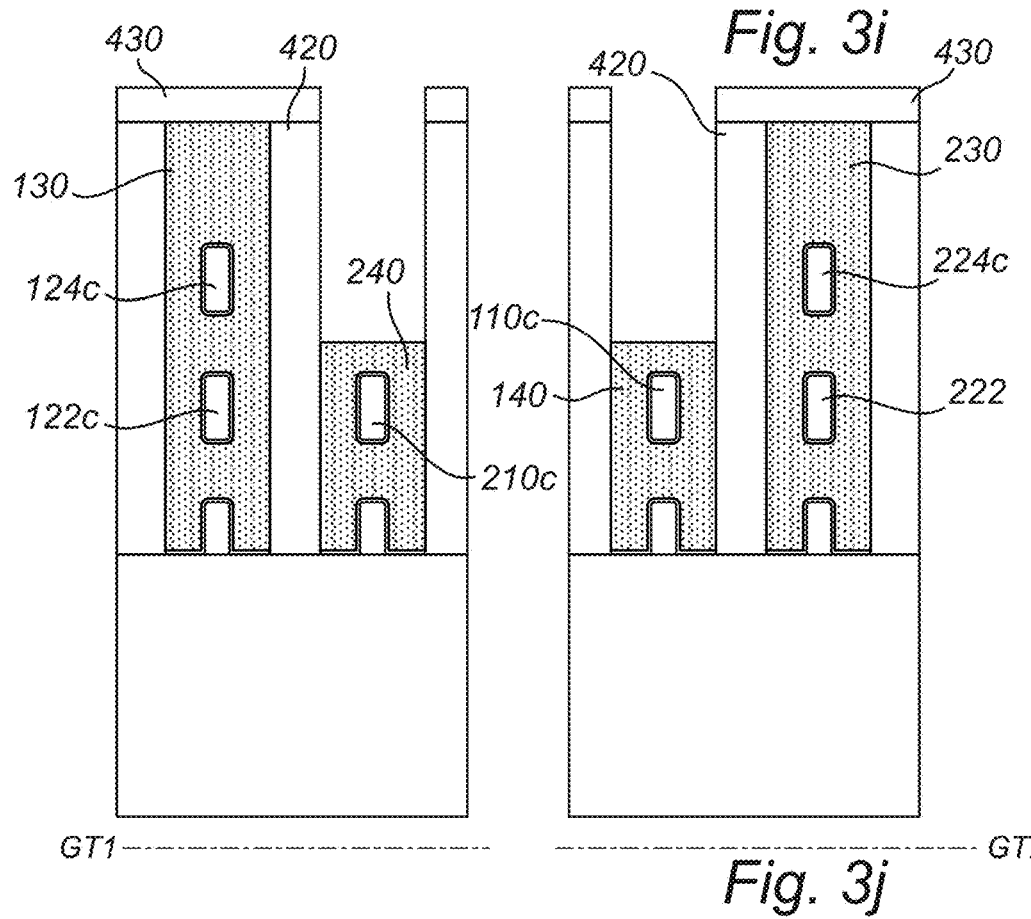

In FIGS. 3i-3j, the left hand side shows a plane view of the structure along the first gate track GT1. The right hand side shows a plane view of the structure along the second gate track GT2. FIGS. 3i-3j illustrate forming of a first tall gate electrode 130 and a second short gate electrode 240 in the first and second gate trench sections 1330, 2340, respectively, and further forming of a second tall gate electrode 230 and a first short gate electrode 140 in the third and fourth gate trench sections 1340, 2330, respectively.

In FIG. 3i, a conductive gate material has been deposited in the first and second gate trench sections 1330, 2340 and in the third and fourth gate trench sections 2330, 1340. The first tall gate electrode 130 is thus formed in the first trench section 1330. The second tall gate electrode 230 is formed in the fourth gate trench section 2330. A first preliminary gate electrode 1140 is formed in the third gate trench section

1340. A second preliminary gate electrode 2240 is formed in the second gate trench section 2340.

The conductive gate material may comprise one or more typical gate materials such as a work function metal and one or more fill metals. Examples of gate materials include suitable gate metals such as TiN, TaN, TiTaN, Al, TiAl, TiC, TiAlC, or suitable combinations or stacks thereof. To ensure complete coverage along the peripheral surfaces of the channels, deposition by ALD may be preferred. However, CVD may also be possible.

Prior to depositing the conductive gate material a gate dielectric, for instance a high-K dielectric, may be deposited by ALD in the gate trench sections 1330, 1304, 2330 2340 to cover the peripheral surfaces of the channels 110c, 122c, 124c, 210c, 222c, 224c.

As shown in FIGS. 3i-3j, the first and second gate trench sections 1330, 2340 and the third and fourth gate trench sections 1340, 2330 alike are surrounded by a gate insulating layer 420. The gate insulating layer 420 may be formed by an oxide material or some other low-k dielectric. Preferably the gate insulating layer 420 is formed of a material different from the contact insulating layer 410. Following deposition of the conductive material in the gate trenches 360, 362, the deposited conductive material may be cut (i.e. by etching) to form discrete gate electrodes 130, 2240 and 1140, 230 of a desired extension along the gate tracks GT1, GT2. The gate cuts may be formed in a conventional manner in a lithography and etching sequence, using for instance a chlorine-based dry etching chemistry. The gate cuts or holes thus formed between the gate electrodes 130, 2240 and 1140, 230, respectively, may then be filled by the gate insulating layer 420. However, it is also possible to form discrete trench sections 1330, 2340 and 1340, 2330 prior to deposition of the conductive material by cutting the sacrificial or dummy gates 332, 342 and filling the cuts in each of the sacrificial or dummy gates by the gate insulating layer 420. Subsequently the remaining sections of the sacrificial or dummy gates 332, 342 may be removed. Thereafter conductive material may be deposited in the gate trenches.

In FIG. 3j an upper surface of the first preliminary gate electrode 1140 and an upper surface of the second preliminary gate electrode 2240 have been recessed by an etch back process to form a first and a second short gate electrode 140, 240 with a height less than a height of the first and second tall gate electrodes 130, 230. A gate recess mask 430 may be formed above the gate trenches, the mask having openings above the first and second preliminary gate electrodes 1140, 2240. The exposed upper surfaces of the first and second preliminary gate electrodes 1140, 2240 may then be etched back through the openings in the gate recess mask 430. For instance, a Chlorine-based dry etching chemistry may be used. Optionally, also the gate electrodes 130, 230 may be slightly etched back in a separate etch process, however to a lesser extent than the first and second preliminary gate electrodes 1140, 2240. In any case, further gate insulating material may be deposited to form a final gate insulating layer 420 covering and embedding the etched-back gate electrodes layer 420.

Figure 3K:
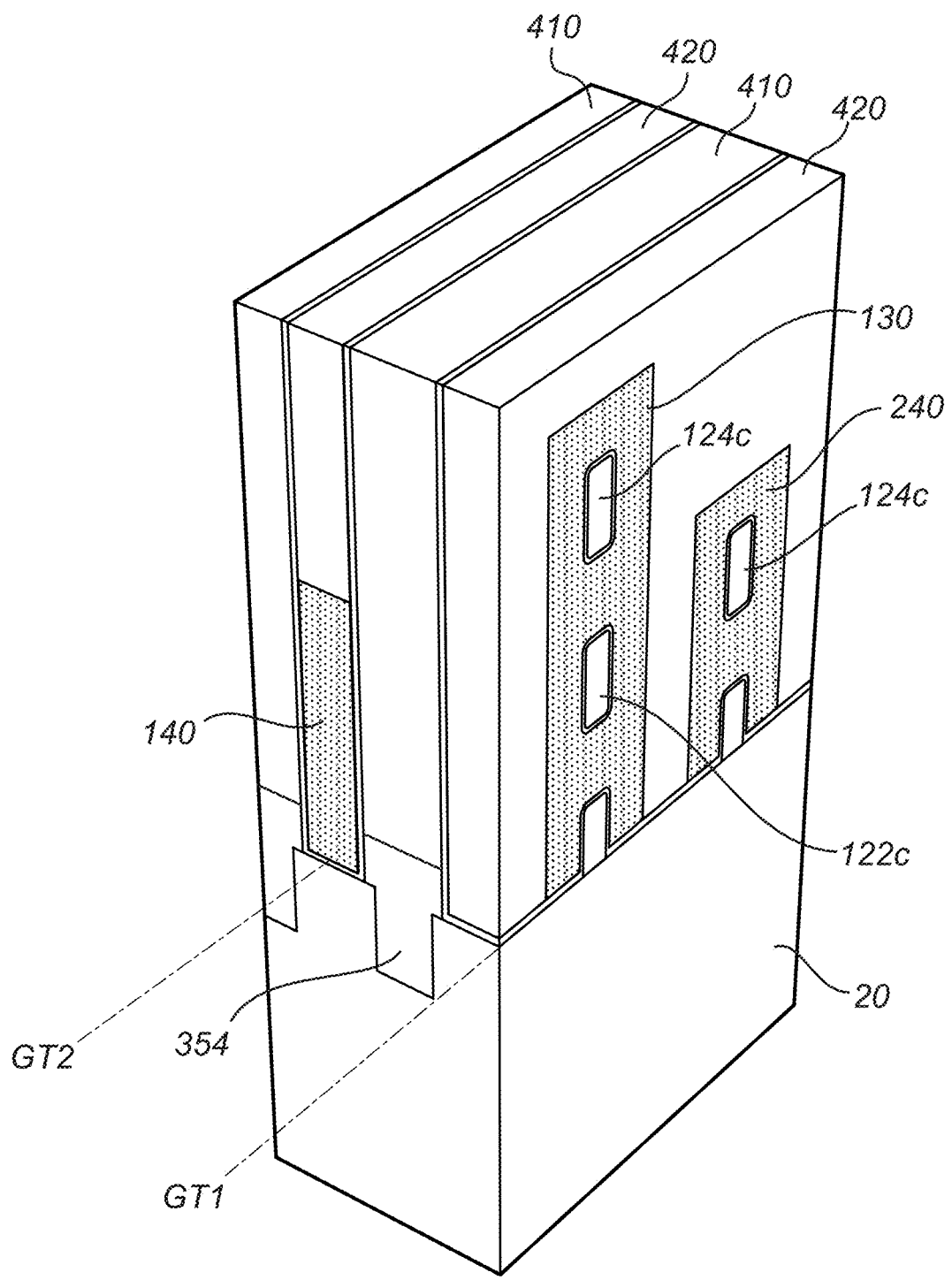

FIG. 3k is a perspective view of the structure wherein the gate insulating layer 420 embeds and covers the gate electrodes 130, 140, 230, 240. The contact insulating layer 410 embeds and covers the source and drain contacts which thus are hidden from view in FIG. 3k.

Figure 3L:
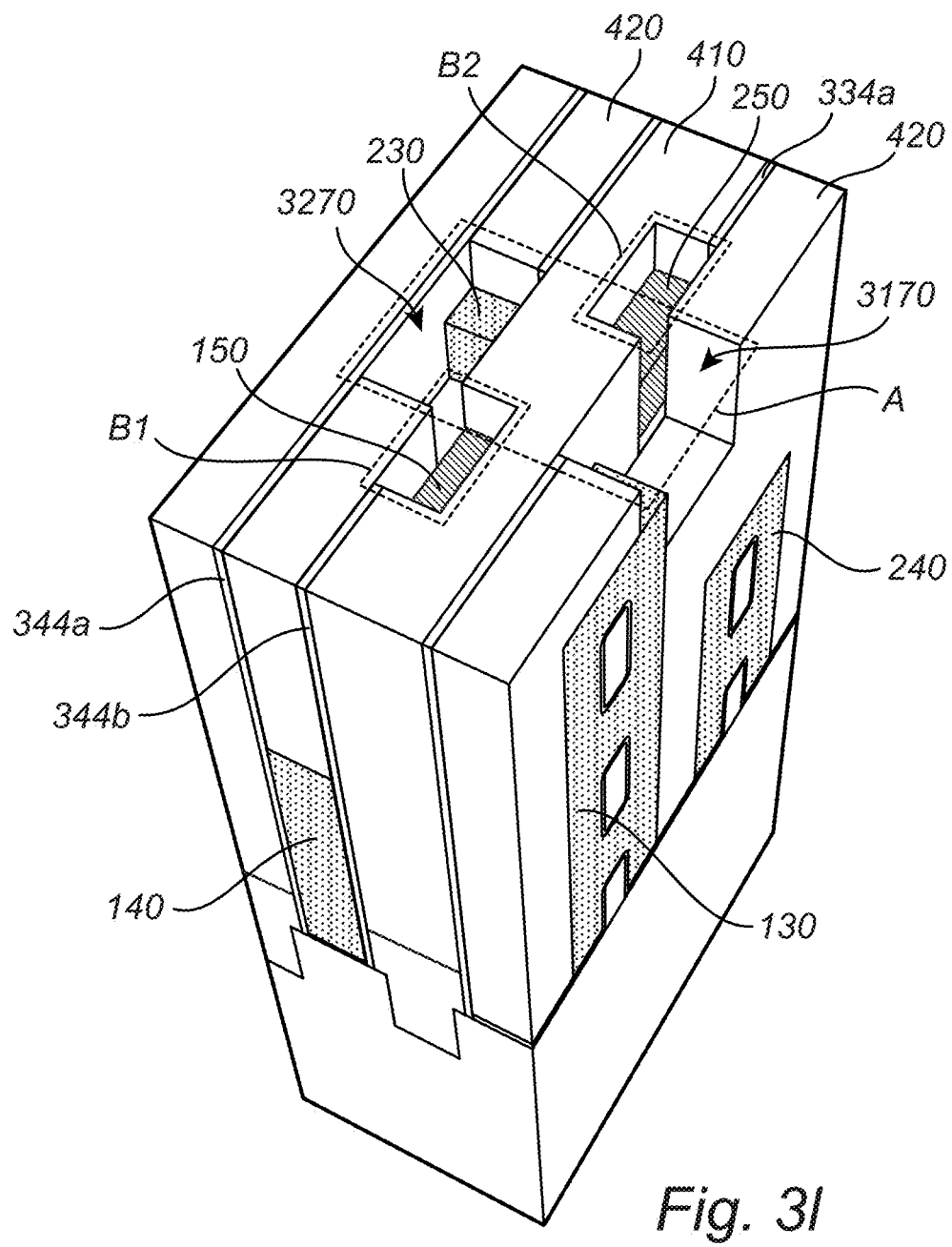

In FIG. 3l a first cross-couple contact trench 3170 has been formed extending horizontally through the gate insulating layer 420 and the contact insulating layer 410. The first cross-couple contact trench 3170 exposes in a first trench portion at least an upper surface of the first tall gate electrode 130 and in a second trench portion at least an upper surface of the second contact arrangement 250. The first trench portion of the first cross-couple contact trench 3170 runs over the second short gate electrode 240. The first and second trench portions are connected across the gate trench sidewall spacer 334a such that the first cross-couple contact trench 3170 extends through the spacer 334a.

Further, a second cross-couple contact trench 3270 has been formed extending horizontally through the gate insulating layer 420 and the contact insulating layer 410. The second cross-couple contact trench 3270 exposes in a first trench portion at least an upper surface of the second tall gate electrode 230 and in a second trench portion at least an upper surface of the first contact arrangement 150. The first trench portion of the second cross-couple contact trench 3270 runs over the first short gate electrode 140. The first and second trench portions are connected across the gate trench sidewall spacer 344b such that the second cross-couple contact trench 3270 extends through the spacer 344b.

Provided the gate insulating layer 420 and the contact insulating layer 410 are formed of different materials, the first and second cross-couple contact trenches 3170, 3270 may be formed in a two-step etch process. A first mask may be formed comprising an opening exposing the regions of the gate insulating layer 420 where the first trench portions of the first and second cross-couple trenches 3170, 3270 are to be formed. The opening is indicated by the dashed box A in FIG. 3l. As shown, the opening may further expose a region of the contact insulating layer 410 between the first trench portions. The gate insulating layer 420 may thereafter be etched selectively to the contact insulating layer 410 through the opening to form the first trench portions. A second mask may be formed comprising first and second openings exposing the regions of the contact insulating layer 410 where the second trench portions of the first and second cross-couple trenches 3170, 3270 are to be formed. The openings are indicated by the dashed boxes B1 and B2 in FIG. 3l. The contact insulating layer 410 may thereafter be etched selectively to the gate insulating layer 420 through the openings B1, B2 to form the second trench portions. Either the first etching step or the second etching step may be configured to etch also portions of the sidewall spacers 334a, 344b exposed in the first and/or second trench portions. Alternatively, portions of the sidewall spacers 334a, 344b exposed in the first and/or second trench portions may be etched in a separate etch step.

Figure 3M:
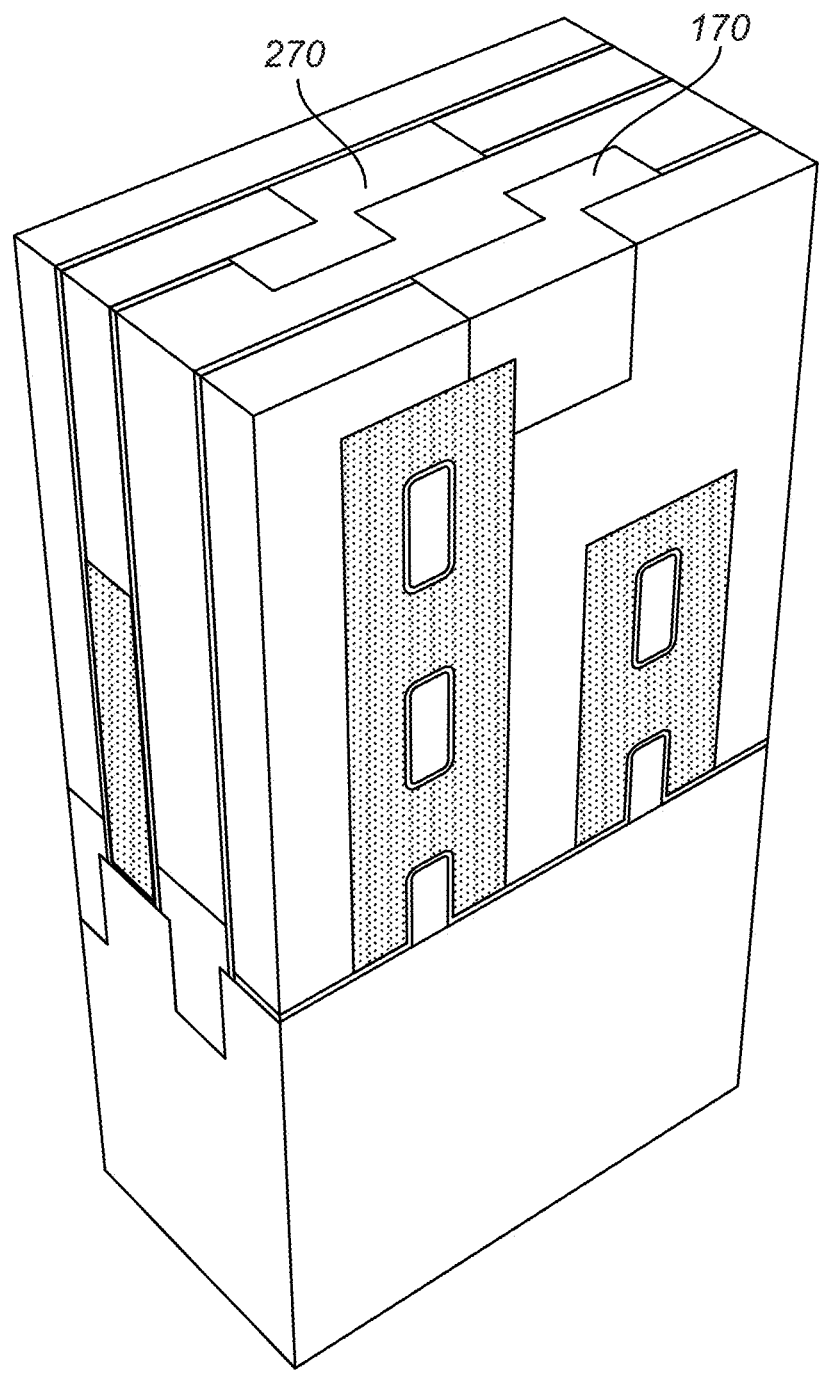

In FIG. 3m a conductive material has been deposited in the first and second cross-couple contact trenches 3170, 3270, thereby forming the first cross-couple contact 170 in the first cross-couple contact trench 3170 and the second cross-couple contact 270 in the second cross-couple contact trench 3270. The cross-couple contacts 170, 270 may for instance be formed of W, Co, Ru or combinations of two or more thereof.

Following formation of the first and second cross-couple contacts 170, 270 the structure may be covered by an inter-layer dielectric and the method may proceed with forming of interconnection levels including wiring lines and vias connecting to the semiconductor device 10, for instance for providing inter-cell routing, providing supply and gate voltages etc.

In the above a method in accordance with the inventive concept has mainly been described with reference to a limited number of examples. However, as is readily appreciated by a person skilled in the art, other examples than the ones disclosed above are equally possible within the scope of the inventive concept, as defined by the appended claims. For instance, in the above process steps have been recited in a particular order. However, it should be noted that other process sequences are possible without departing from the scope of the claims. As one example, instead of forming the gate electrodes after the source and drain regions and source and drain contacts, it may also be possible to form the gate electrodes prior to forming the source and drain regions and the source and drain contacts. It should further be noted that it may be possible to combine the process steps for forming the cross-couple contacts with a non-replacement metal gate process. If for example the transistors channels are formed from fins 310, 320 comprising oxide sacrificial layers 311, 321, 313, 323, wire-release may be omitted which may allow a gate first technique to be used instead.

What is claimed is:

1. A semiconductor device, comprising:
    first and second sets of transistors arranged on a substrate, each set comprising a pass transistor and a stacked complementary transistor pair including a lower transistor and an upper transistor,
    wherein each transistor of the first set comprises a semiconductor channel extending between respective source and drain regions along a horizontal first fin track, and each transistor of the second set comprises a semiconductor channel extending between respective source and drain regions along a second fin track parallel to the first fin track, and
    wherein the semiconductor channels of the pass transistors and the semiconductor channels of the lower transistors are arranged at a first level vertically above the substrate and the semiconductor channels of the upper transistors are arranged at a second level vertically above the first level;
    a first tall gate electrode forming a common gate for the semiconductor channels of the first complementary transistor pair and arranged along a horizontal first gate track transverse to the first and second fin tracks;
    a first short gate electrode having a shorter height relative to the first tall gate electrode and forming a gate for the semiconductor channel of the first pass transistor and arranged along a second gate track parallel to the first gate track;
    a second tall gate electrode forming a common gate for the semiconductor channels of the second complementary transistor pair and arranged along the second gate track;
    a second short gate electrode having a shorter height relative to the second tall gate electrode and forming a gate for the semiconductor channel of the second pass transistor and arranged along the first gate track;
    first and second contact arrangements arranged between the first and second gate tracks and forming a common drain contact for the transistors of the first set and the second set, respectively;
    a first cross-couple contact extending horizontally between and interconnecting the first tall gate electrode and the second contact arrangement; and
    a second cross-couple contact extending horizontally between and interconnecting the second tall gate electrode and the first contact arrangement.

2. The semiconductor device according to claim 1, wherein the first cross-couple contact comprises a first end in contact with the first tall gate electrode at a first interface, a second end in contact with the second contact arrangement at a second interface, and a body extending from the first interface to the second interface in a horizontal path.

3. The semiconductor device according to claim 2, wherein the horizontal path runs above the second short gate electrode.

4. The semiconductor device according to claim 1, wherein the second cross-couple contact comprises a first end in contact with the second tall gate electrode at a first interface, a second end arranged in contact with the first contact arrangement at a second interface, and a body extending from the first interface to the second interface in a horizontal path.

5. The semiconductor device according to claim 1, wherein the first tall gate electrode and the second short gate electrode are arranged between a first pair of gate trench spacers extending on opposite sides of and along the first gate track, wherein the first cross-couple contact extends through the sidewall spacer of said pair which is arranged between the first gate track and the second contact arrangement.

6. The semiconductor device according to claim 1, wherein the second tall gate electrode and the first short gate electrode are arranged between a second pair of dielectric sidewall spacers extending on opposite sides of and along the second gate track, wherein the second cross-couple contact extends through the sidewall spacer of the pair which is arranged between the second gate track and the first contact arrangement.

7. The semiconductor device according to claim 1, wherein an upper surface of each of the first and second short gate electrodes is arranged at a third level below said second level.

8. A method of forming a semiconductor device, the method comprising:
    forming first and second sets of transistors on a substrate along a horizontal first fin track and a second fin track parallel to the first fin track, respectively, each set comprising a pass transistor and a stacked complementary transistor pair including a lower transistor and an upper transistor,
    wherein forming the stacked complementary transistor pair of the first set comprises forming a lower semiconductor channel at a first level above the substrate and an upper semiconductor channel at a second level above the first level, the lower and upper semiconductor channels extending between respective source and drain regions along the first fin track, and forming a first tall gate electrode along a horizontal first gate track transverse to the first and second fin tracks, the first tall gate electrode forming a common gate for the upper and lower semiconductor channels,
    wherein forming the pass transistor of the first set comprises forming a first pass transistor semiconductor channel at the first level, the first pass transistor semiconductor channel extending between a source region and a drain region along the first fin track, and forming a first short gate electrode along a second gate track parallel to the first gate track, the first short gate electrode having a shorter height relative to the first tall gate electrode and forming a gate for the first pass transistor semiconductor channel,
    wherein forming the stacked complementary transistor pair of the second set comprises forming a lower semiconductor channel at the first level and an upper semiconductor channel at the second level, the lower and upper semiconductor channels extending between respective source and drain regions along the second fin track, and forming a second tall gate electrode along the second gate track, the second tall gate electrode forming a common gate for the upper and lower semiconductor channels, and wherein forming the pass transistor of the second set comprises forming a second pass transistor semiconductor channel at the first level, the second pass transistor semiconductor channel extending between a source region and a drain region along the second fin track, and forming a second short gate electrode along the first gate track, the second short gate electrode having a shorter height relative to the second tall gate electrode and forming a gate for the second pass transistor semiconductor channel;

forming first and second contact arrangements along a contact track extending parallel to and between the first and second gate tracks, the first and second contact arrangements forming a common drain contact for the transistors of the first set and the transistors of the second set, respectively;

forming a first cross-couple contact extending horizontally between and interconnecting the first tall gate electrode and the second contact arrangement; and forming a second cross-couple contact extending horizontally between and interconnecting the second tall gate electrode and the first contact arrangement.

9. The method according to claim 8, wherein, subsequent to forming the first and second contact arrangements along the contact track, covering the first and second contact arrangements with a contact insulating layer, and wherein, subsequent to forming the gate electrodes along the first and second gate tracks, covering the gate electrodes with a gate insulating layer, and wherein forming the first and second cross-couple contacts comprises:
 forming a first cross-couple contact trench and a second cross-couple contact trench extending horizontally through the gate and contact insulating layers, the first cross-couple contact trench exposing the first tall gate electrode and the second contact arrangement, and the second cross-couple contact trench exposing the second tall gate electrode and the first contact arrangement, and depositing a conductive material in the first and second cross-couple contact trenches.

10. The method according to claim 9, wherein forming the first cross-couple contact trench comprises:
 forming a first trench portion in the gate insulating layer exposing an upper portion of the first tall gate electrode and running above the second short gate electrode, and
 forming a second trench portion in the contact insulating layer exposing an upper portion of the second contact arrangement; and wherein forming the second cross-couple contact trench comprises:
 forming a first trench portion in the gate insulating layer exposing an upper portion of the second tall gate electrode and running above the first short gate electrode, and
 forming a second trench portion in the contact insulating layer exposing an upper portion of the first contact arrangement.

11. The method according to claim 9, wherein the first tall gate electrode and the second short gate electrode are formed in a first gate trench section and a second gate trench section, respectively, formed along the first gate track, the first and second gate trench sections being formed between a first pair of gate trench spacers extending along the first gate track, wherein the second tall gate electrode and the first short gate electrode are formed in a third gate trench section and a fourth gate trench section, respectively, formed along the second gate track, the third and fourth gate trench sections being formed between a second pair of gate trench spacers extending along the second gate track, and wherein the first cross-couple contact trench is formed to extend through the sidewall spacer of the first pair which is arranged between the first gate track and the second contact arrangement and the second cross-couple contact trench is formed to extend through the sidewall spacer of the second pair which is arranged between the second gate track and the first contact arrangement.

12. The method according to claim 8, wherein forming the gate electrodes comprises:

depositing a conductive gate material in a first gate trench section and a second gate trench section formed along the first gate track, the first gate trench section extending across the first fin track and the second gate trench section extending across the second fin track, and in a third gate trench section and a fourth gate trench section formed along the second gate track, the third gate trench section extending across the second fin track and the fourth gate trench section extending across the first fin track; and etching back an upper surface of the conductive gate material deposited in the second gate trench section and an upper surface of the conductive gate material deposited in the fourth gate trench section, thereby forming the first and second short gate electrodes with a height less than a height of the first and second tall gate electrodes.

13. The method according to claim 12, further comprising:

forming a first sacrificial gate extending along the first gate track and across the first and second fin tracks, and a second sacrificial gate extending along the second gate track and across the first and second fin tracks; and forming an insulating layer along the first and second sacrificial gates, wherein the gate trench sections are formed by removing the first and second sacrificial gates.

14. The method according to claim 8, wherein forming the semiconductor channels of the first and second sets of transistors comprises:

forming a first semiconductor fin and a second semiconductor fin extending along the first and second fin tracks, respectively, each fin comprising a lower semiconductor layer and an upper semiconductor layer;

selectively removing the upper semiconductor layer along a horizontal first portion of the first semiconductor fin, along which the first pass transistor semiconductor channel is to be formed, such that the first semiconductor fin protrudes by a first height above the substrate along the first portion and by a second height above the substrate, greater than the first height, along a horizontal second portion of the first fin, along which the first lower and upper semiconductor channels are to be formed; and selectively removing the upper semiconductor layer along a horizontal first portion of the second semiconductor fin, along which the second pass transistor semiconductor channel is to be formed, such that the second semiconductor fin protrudes by the first height above the substrate along the first portion and by the second height above the substrate along a horizontal second portion of the second fin, along which the second lower and upper semiconductor channels are to be formed.

15. The method according to claim 14, wherein each of the first and second semiconductor fins comprises a sacrificial layer intermediate the lower and the upper semiconductor layers, the method further comprising:

prior to forming said gate electrodes, removing the sacrificial layer of each of the first and second semiconductor fins.

* * * * *